US006861279B2

United States Patent
Nakanishi et al.

(10) Patent No.: US 6,861,279 B2
(45) Date of Patent: Mar. 1, 2005

(54) METHOD OF MANUFACTURING ELECTRO-OPTICAL DEVICE, ELECTRO-OPTICAL DEVICE, AND ELECTRONIC APPARATUS

(75) Inventors: Hayato Nakanishi, Toyama (JP); Mitsuru Kuribayashi, Chino (JP); Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/414,209

(22) Filed: Apr. 16, 2003

(65) Prior Publication Data

US 2004/0018677 A1 Jan. 29, 2004

(30) Foreign Application Priority Data

| Apr. 18, 2002 | (JP) | 2002-116696 |
| Apr. 18, 2002 | (JP) | 2002-116697 |
| Apr. 15, 2003 | (JP) | 2003-110695 |

(51) Int. Cl.$^7$ ............................................ H01L 21/00
(52) U.S. Cl. ........................ 438/69; 438/88; 438/103
(58) Field of Search ............................. 438/69, 73, 78, 438/88, 101, 103

(56) References Cited

U.S. PATENT DOCUMENTS

| 3,719,855 A | * | 3/1973 | Staffa et al. ............... 313/338 |
| 5,783,363 A | * | 7/1998 | Thomas ..................... 430/296 |
| 6,593,001 B1 | * | 7/2003 | Watanabe ................... 428/464 |

* cited by examiner

Primary Examiner—Phuc T. Dang
(74) Attorney, Agent, or Firm—Oliff & Berridge, PLC

(57) ABSTRACT

The invention provides an electro-optical device and a manufacturing method therefor which makes it possible to manufacture power source wiring lines more simply. Power source wiring lines are formed by an inkjet method.

13 Claims, 27 Drawing Sheets

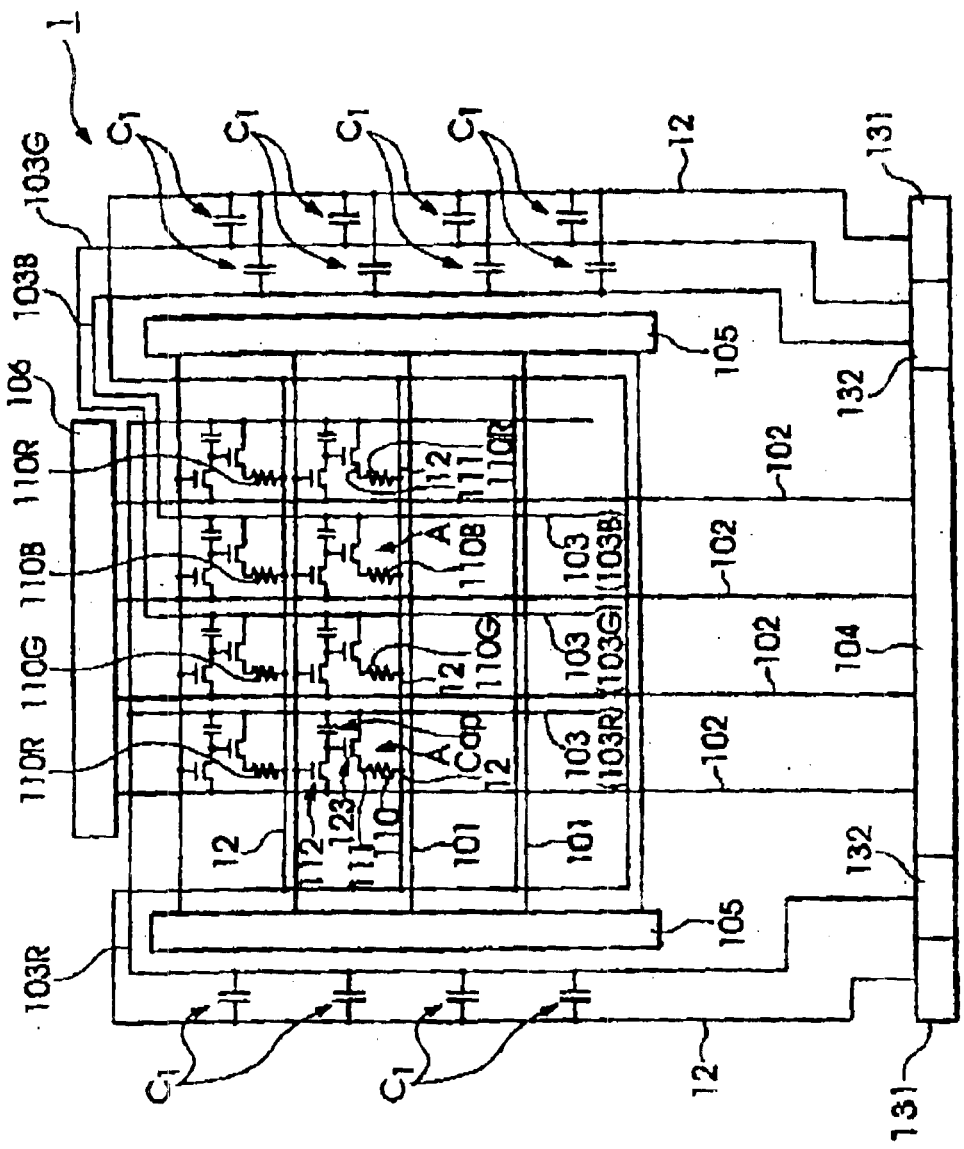
[Fig. 1]

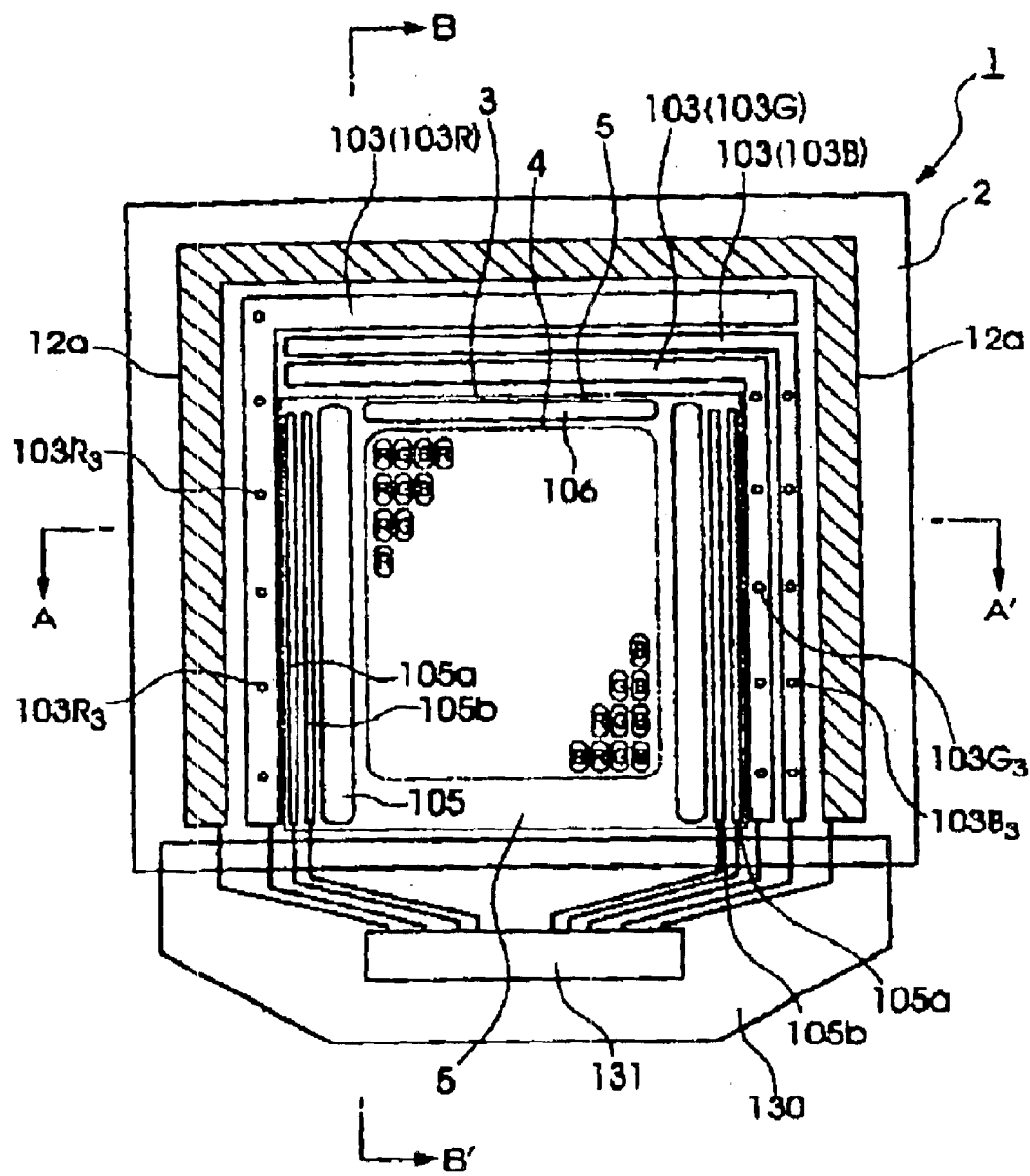

[Fig. 3]
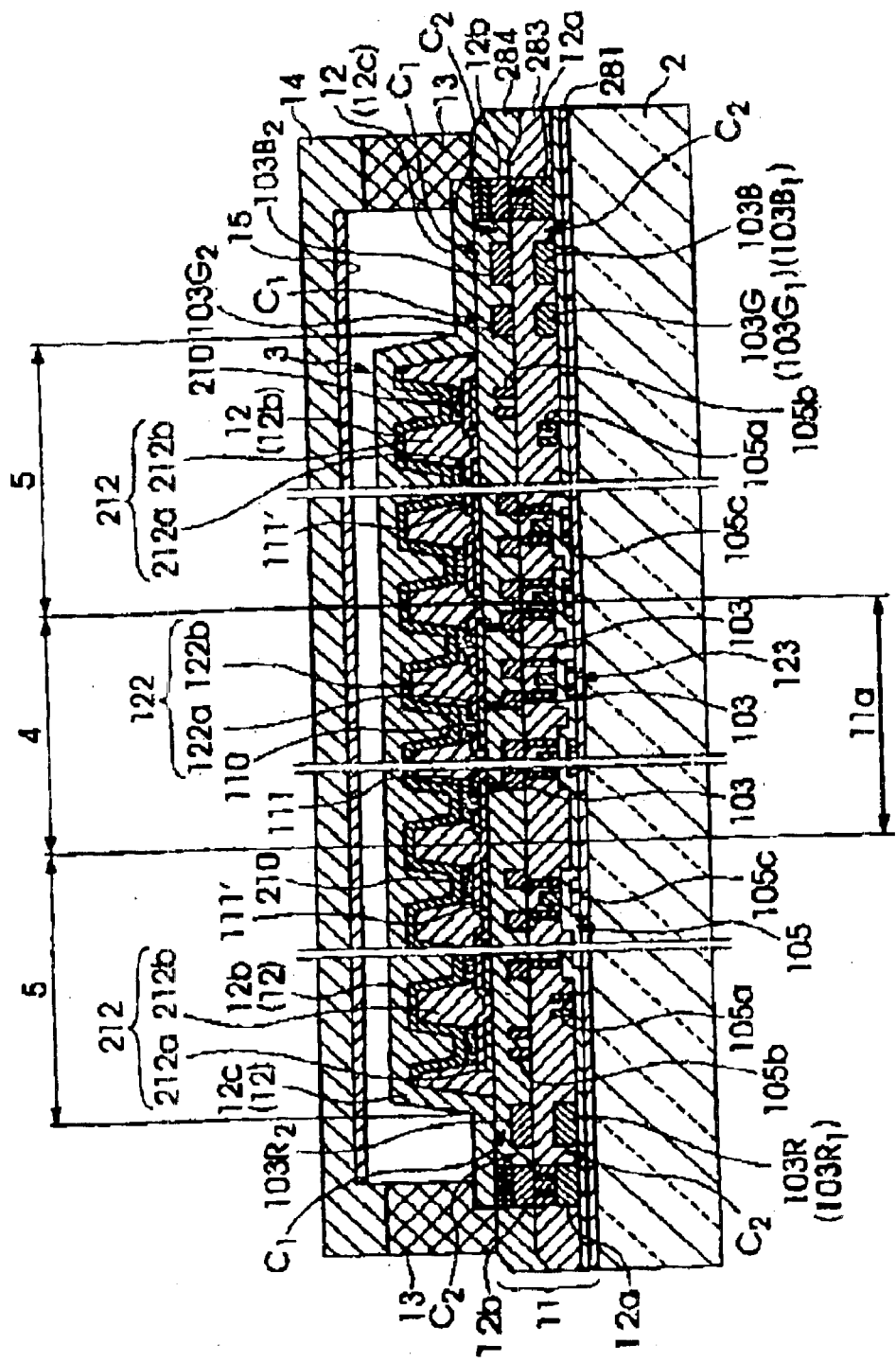

[Fig. 4]
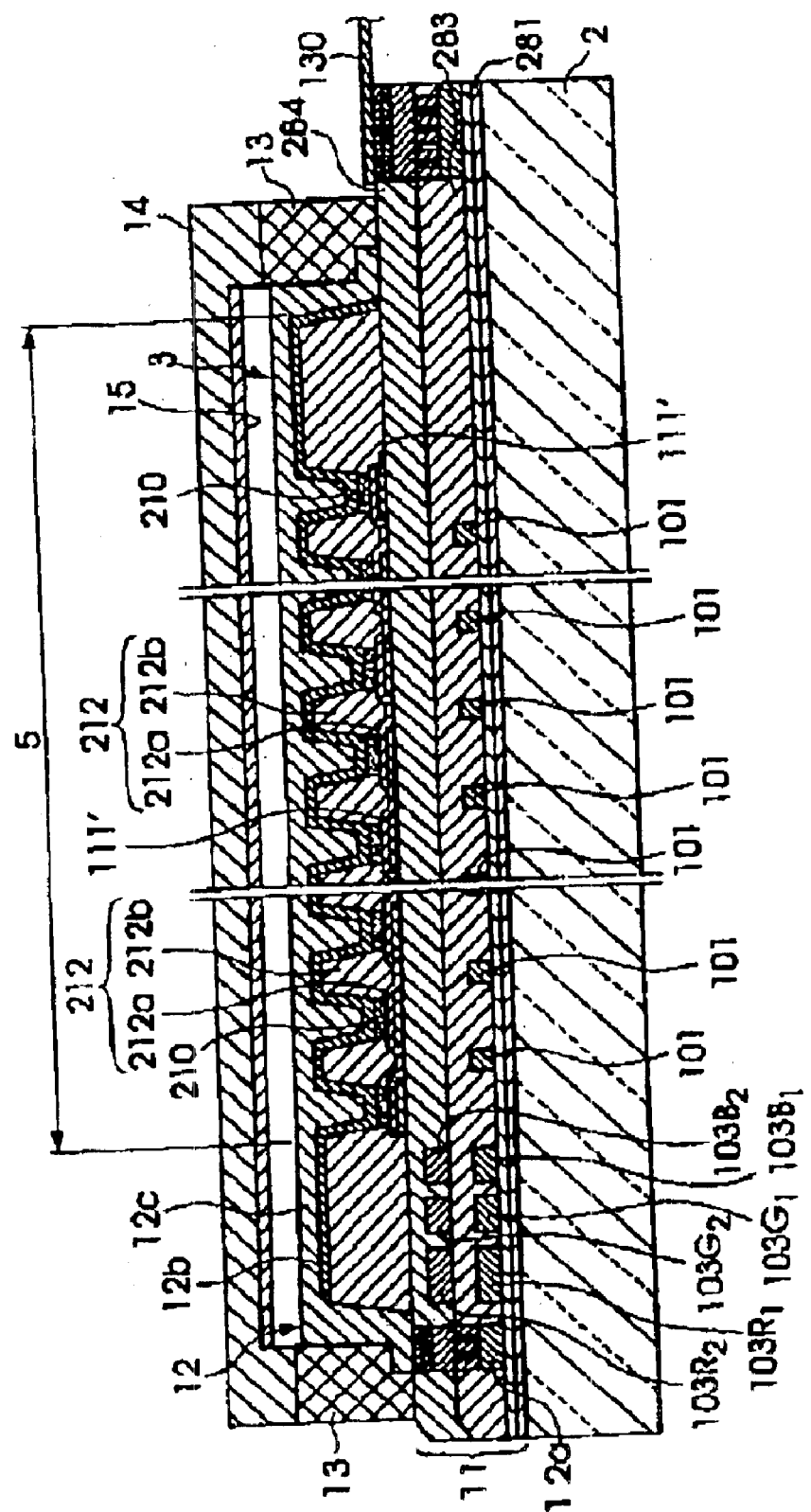

[Fig. 5]
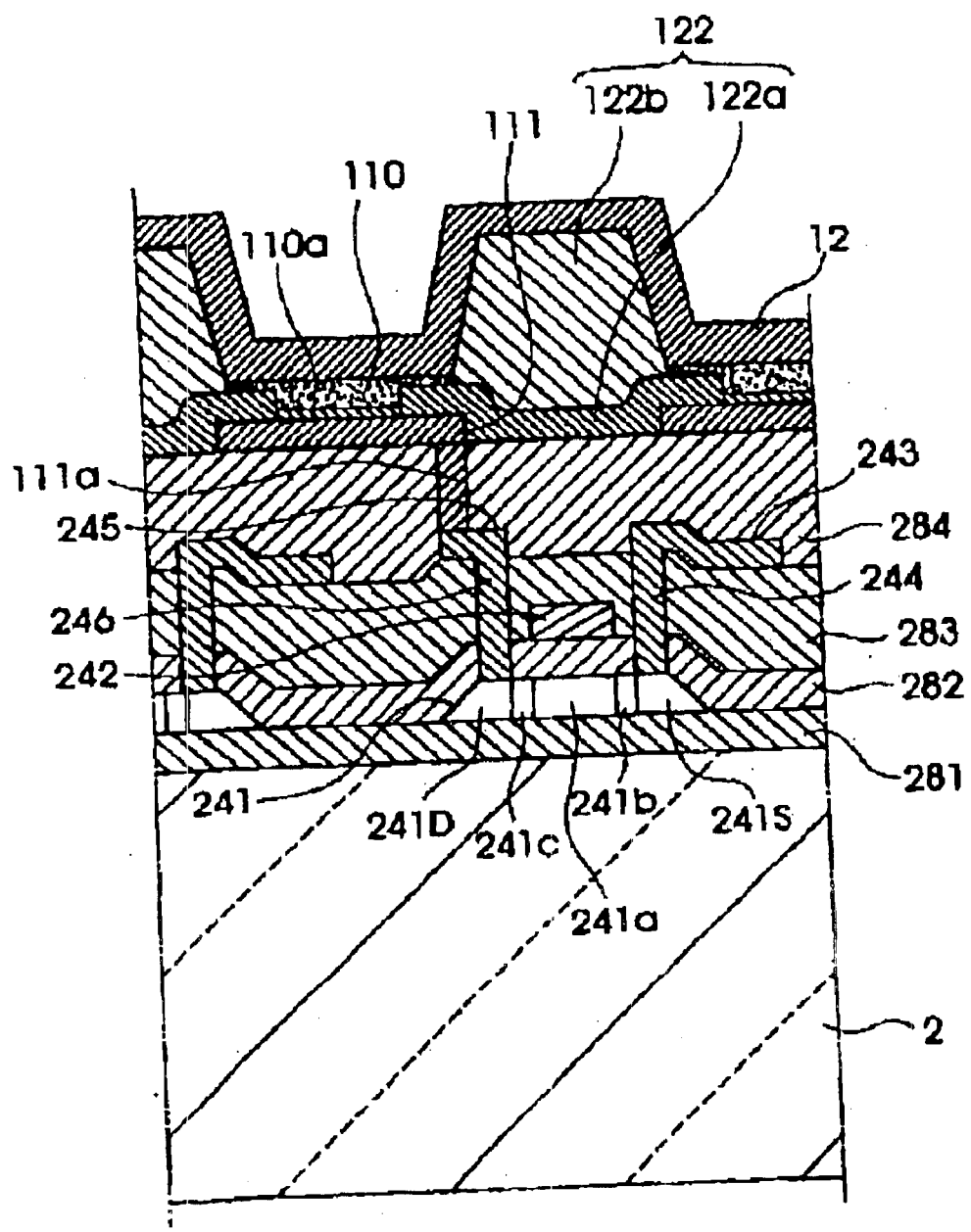

[Fig. 6]
(a)
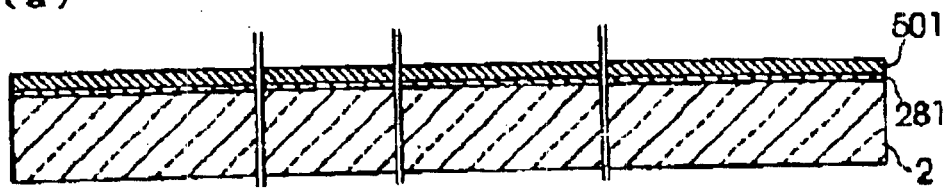
(b)
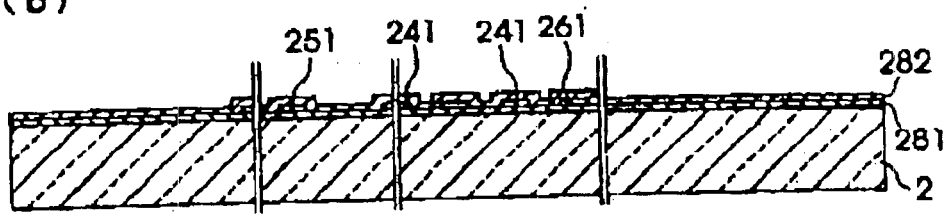
(c)
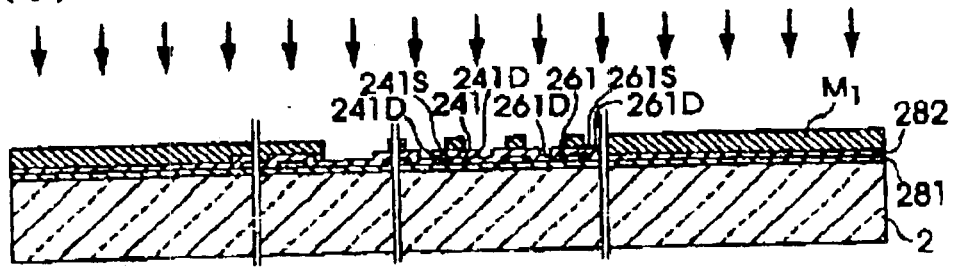
(d)
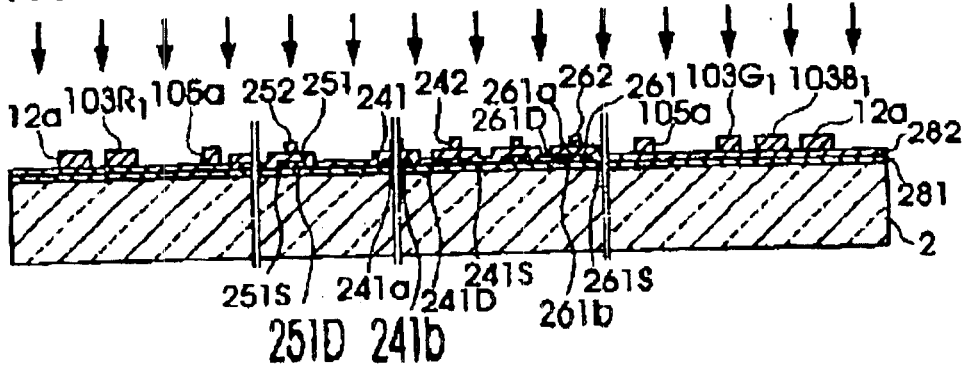

[Fig. 7]
(a)
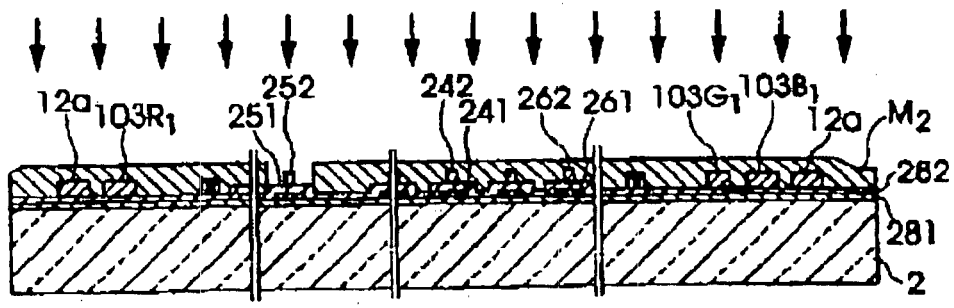
(b)
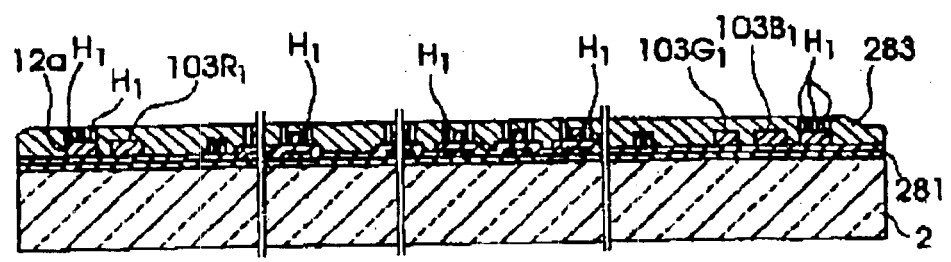
(c)
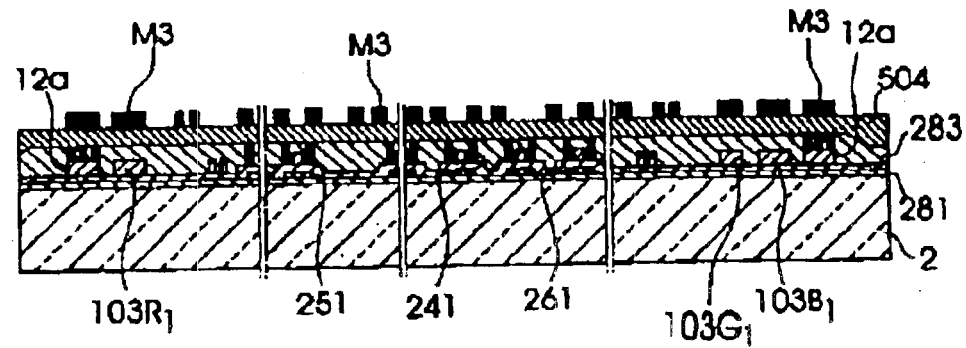

[Fig. 8]
(a)
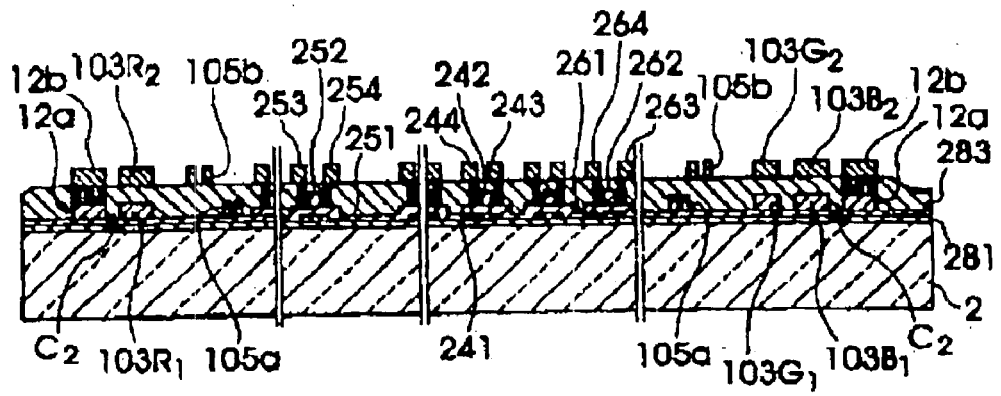
(b)
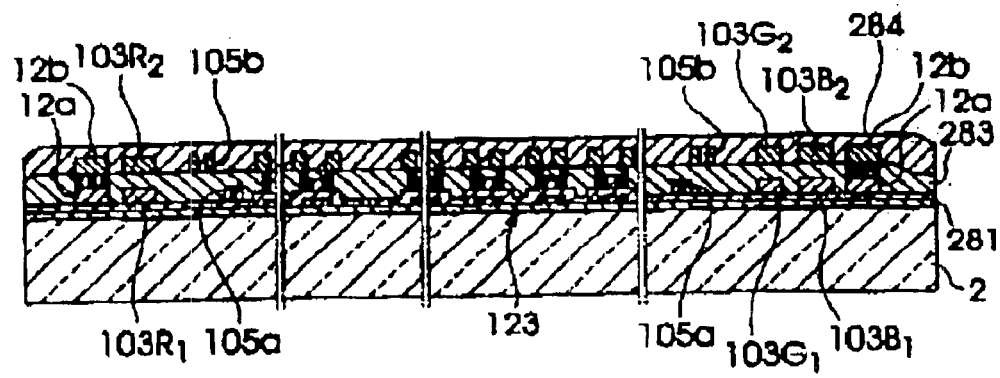
(c)
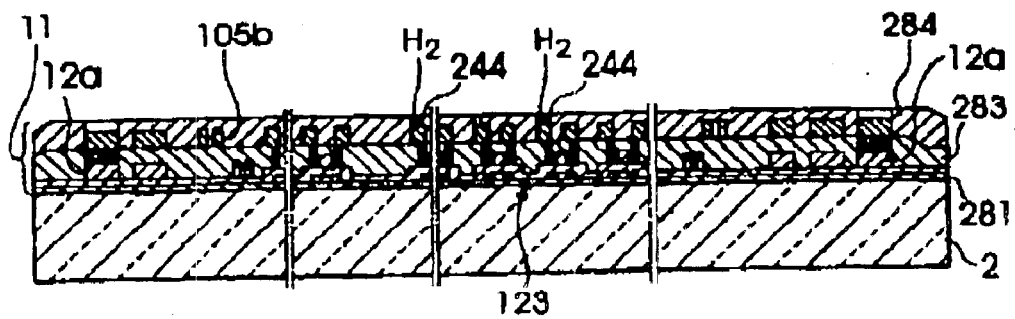

[Fig. 9]
(a)
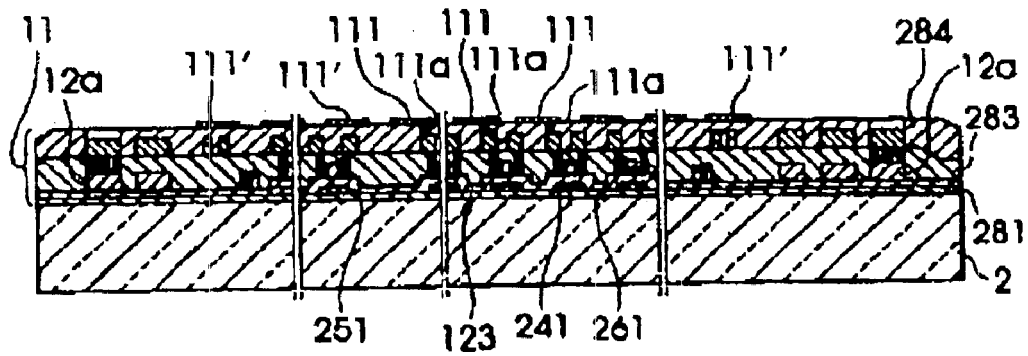
(b)
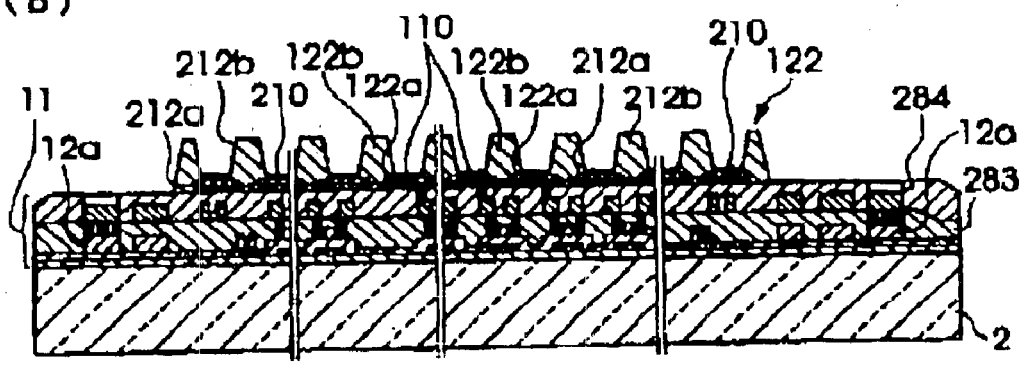
(c)
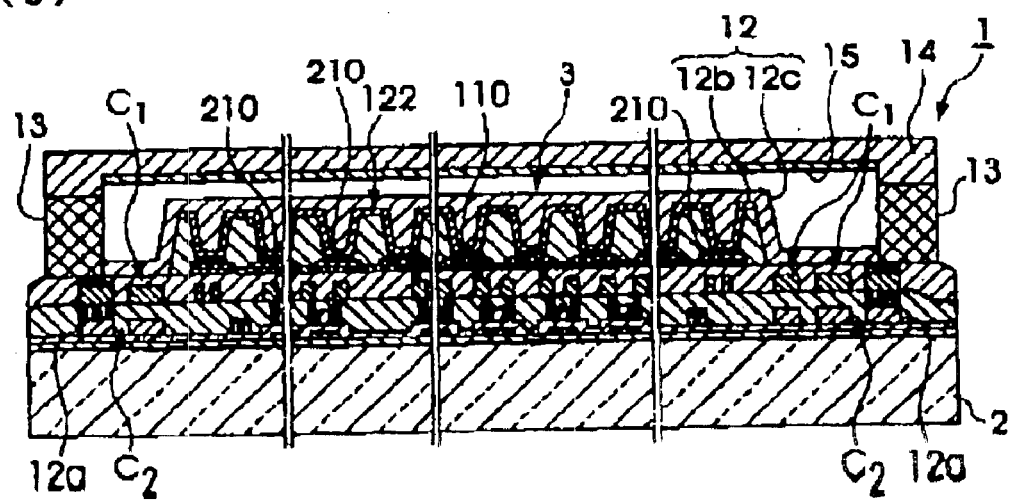

[Fig. 10]
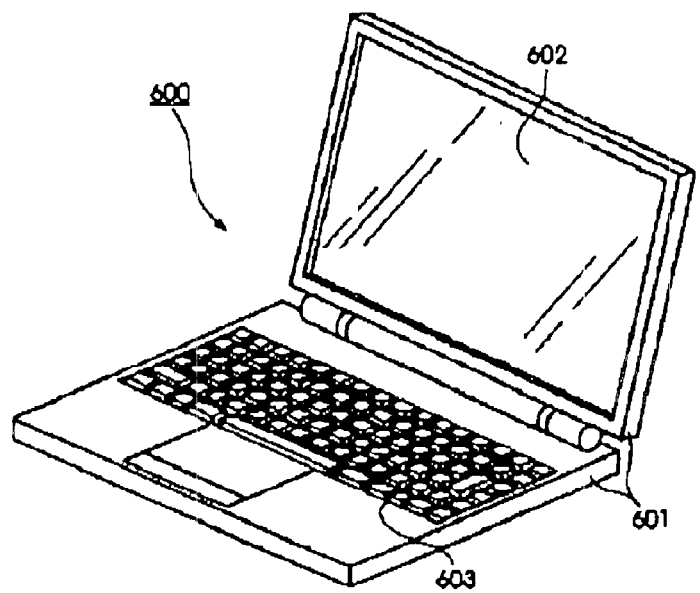
[Fig. 11]
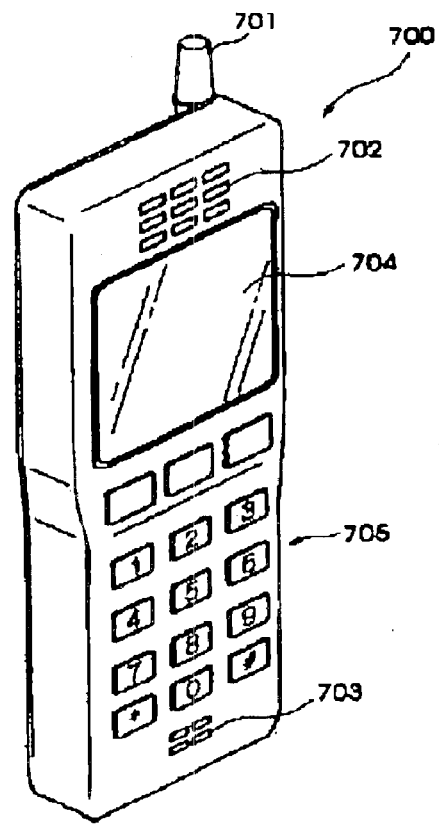

[Fig. 12]
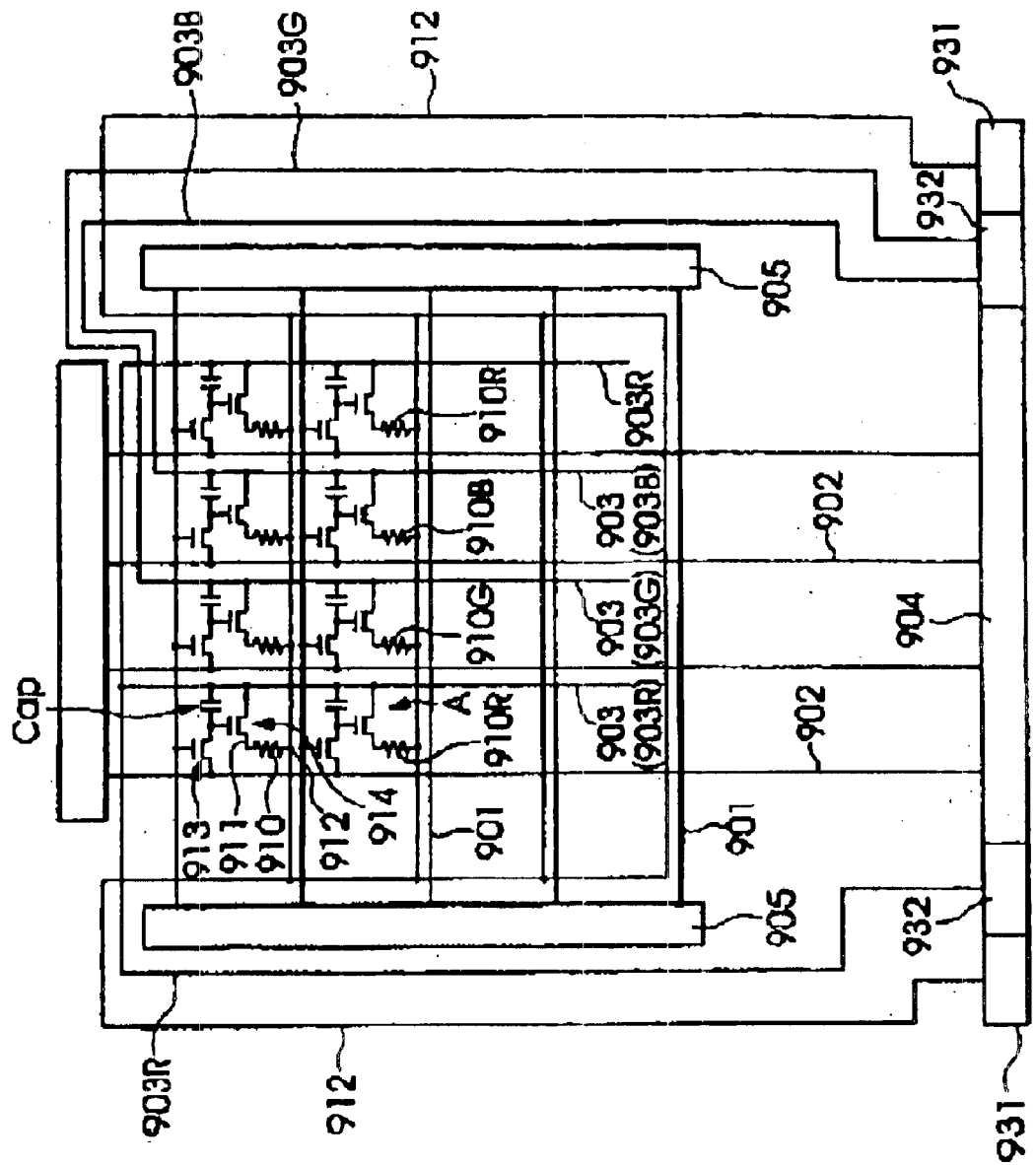

[Fig. 13]
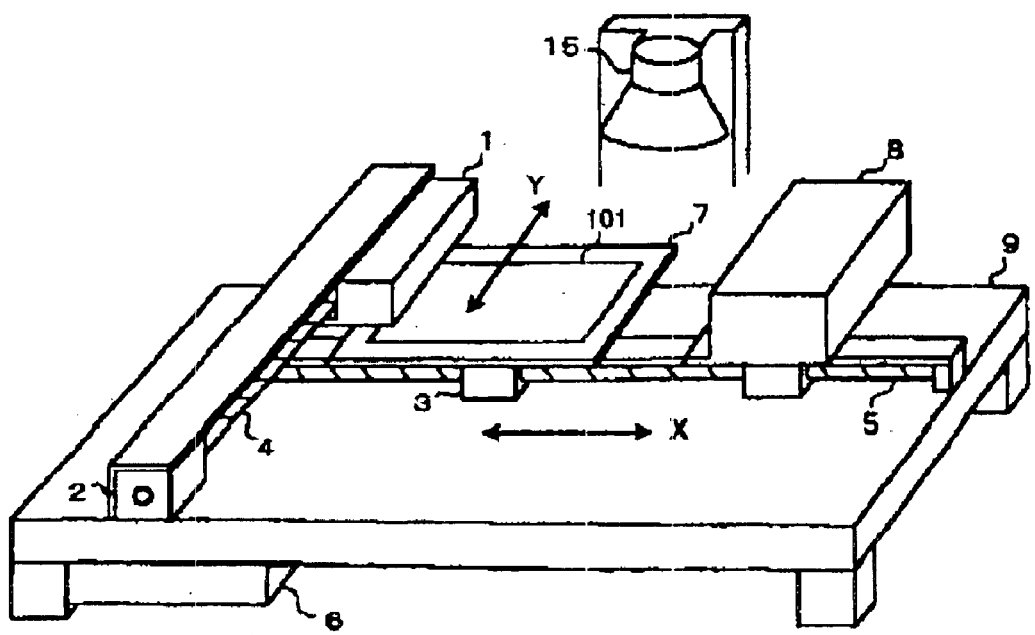
100: WIRING LINE FORMATION APPARATUS

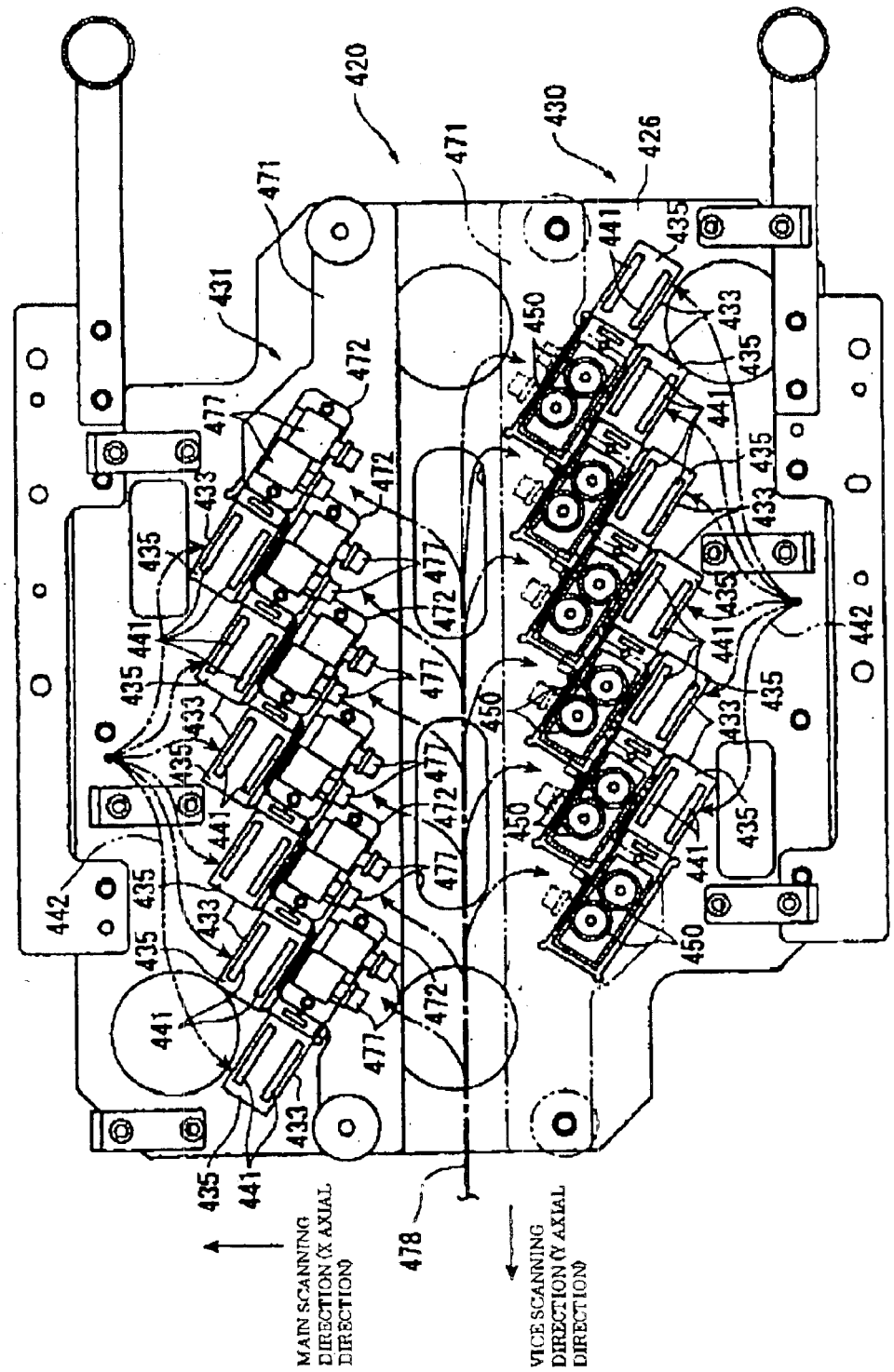
[Fig. 14]

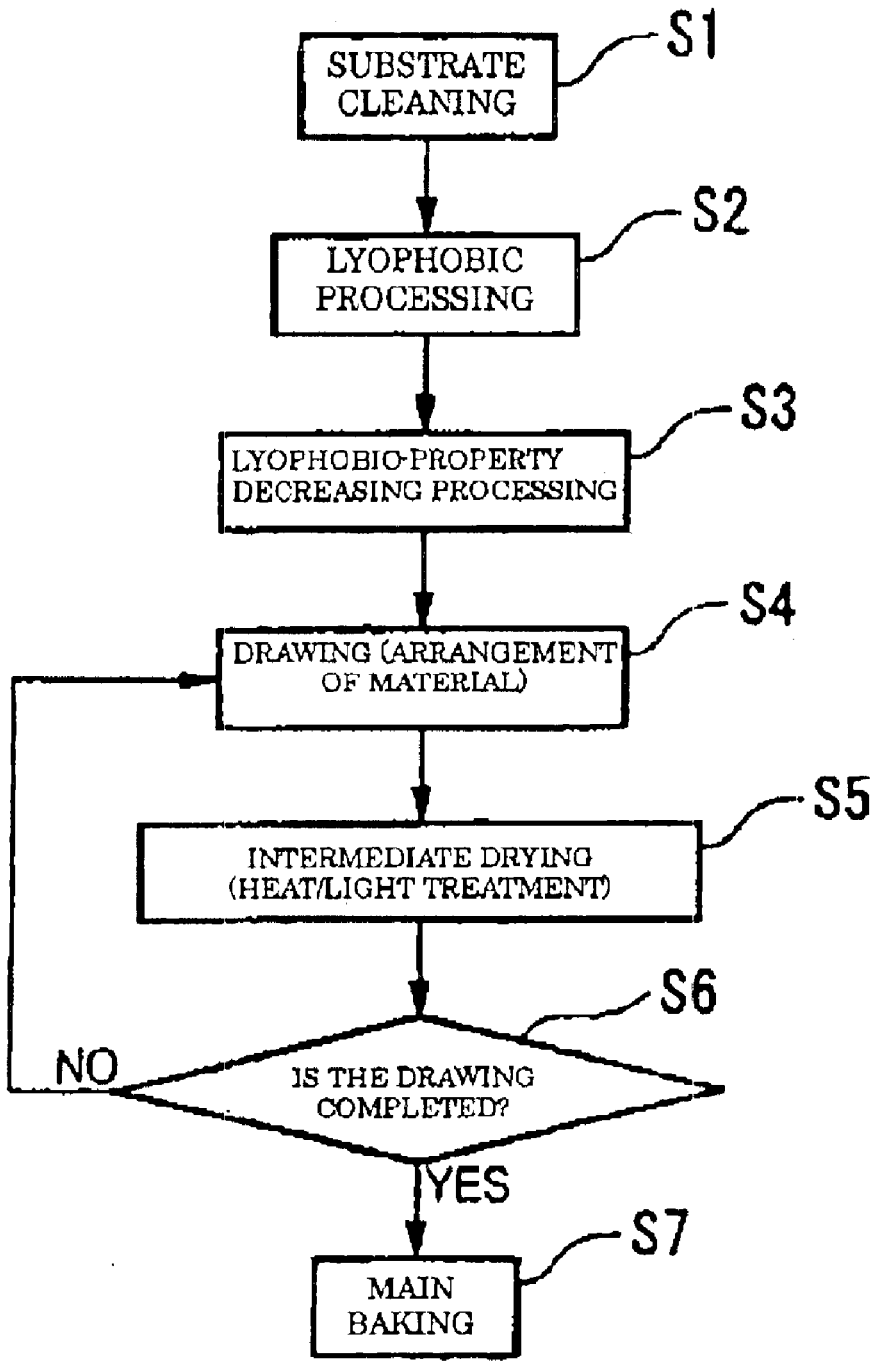
[Fig. 15]

[Fig. 16]
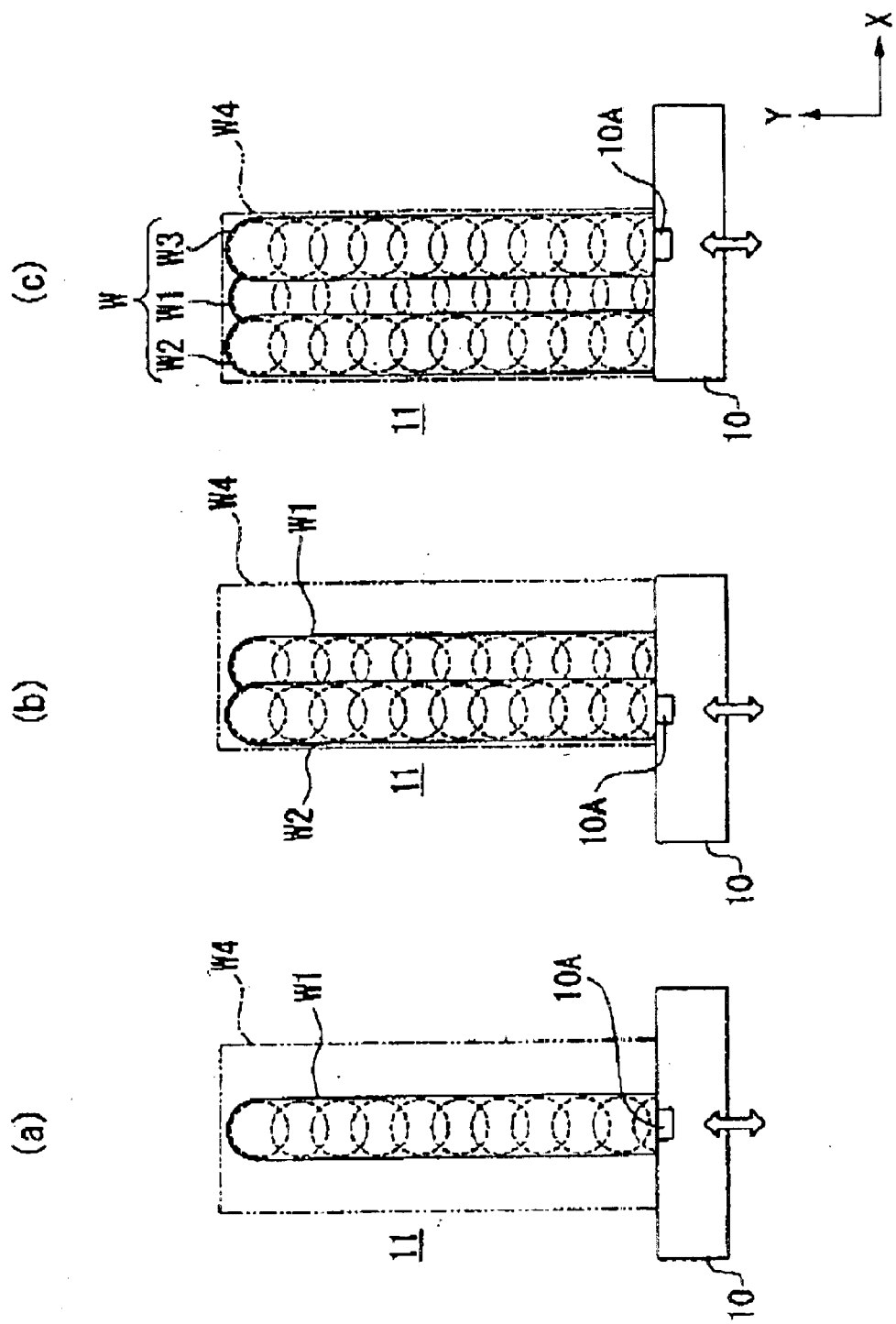

[Fig. 17]
(a)
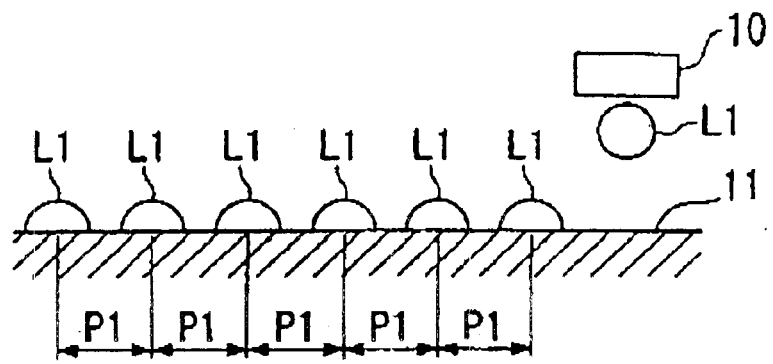
(b)
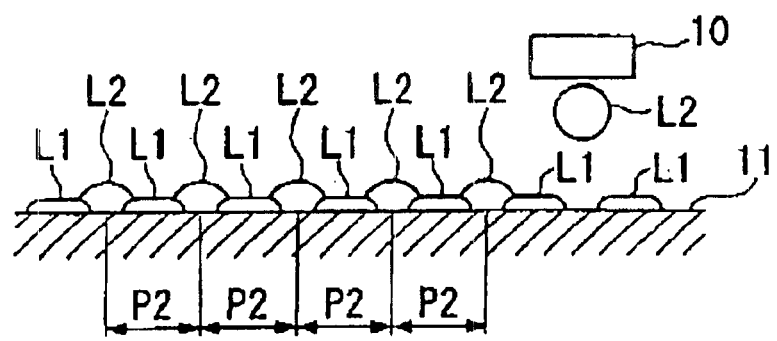
(c)
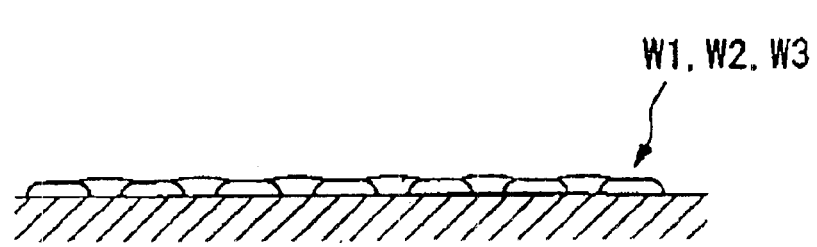

[Fig. 18]
(a)
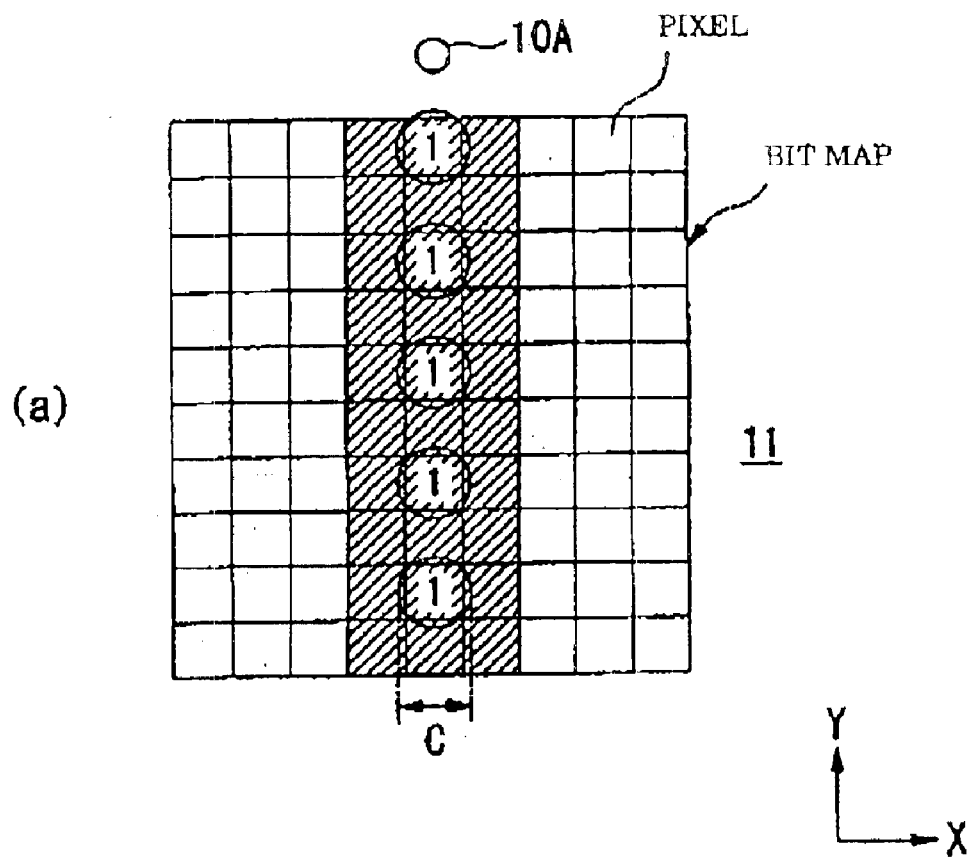
(b)
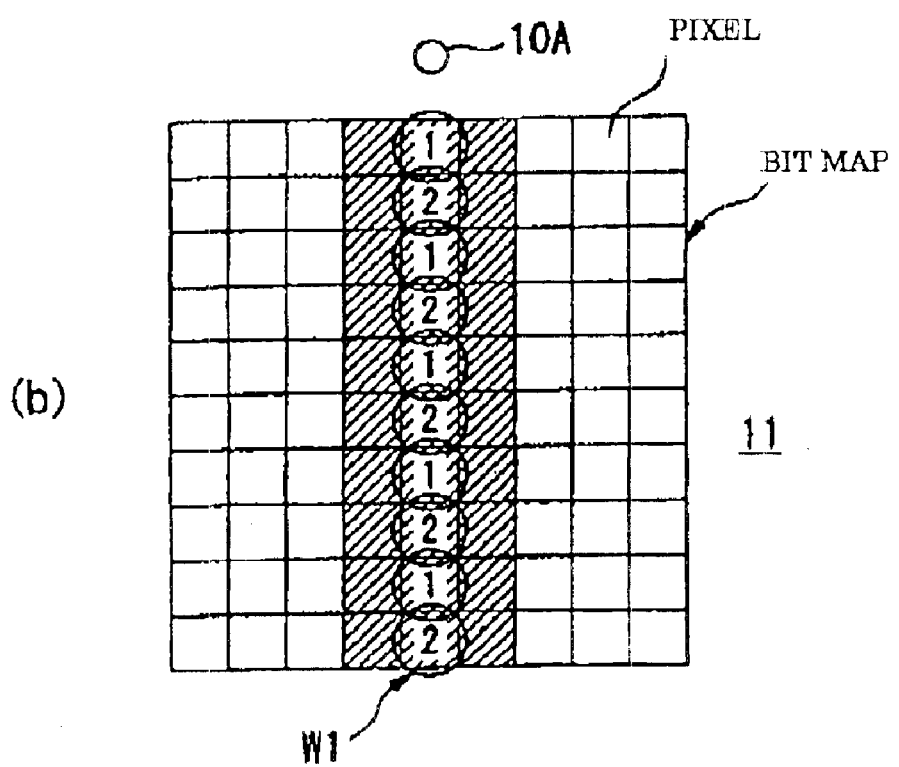

[Fig. 19]
(a)
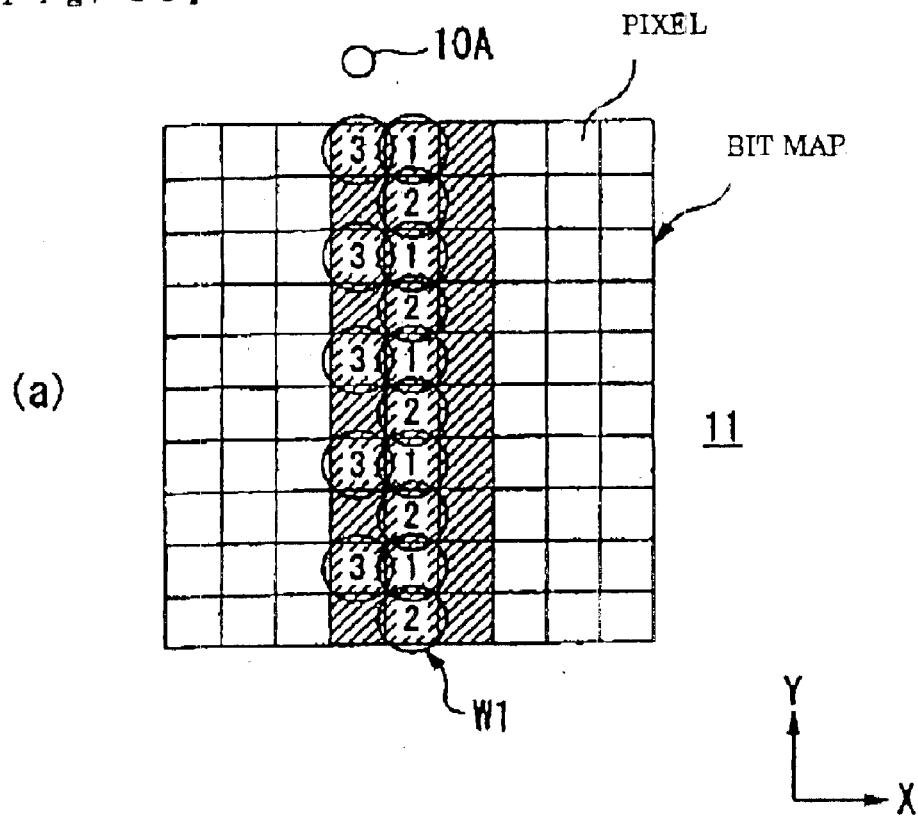
(b)
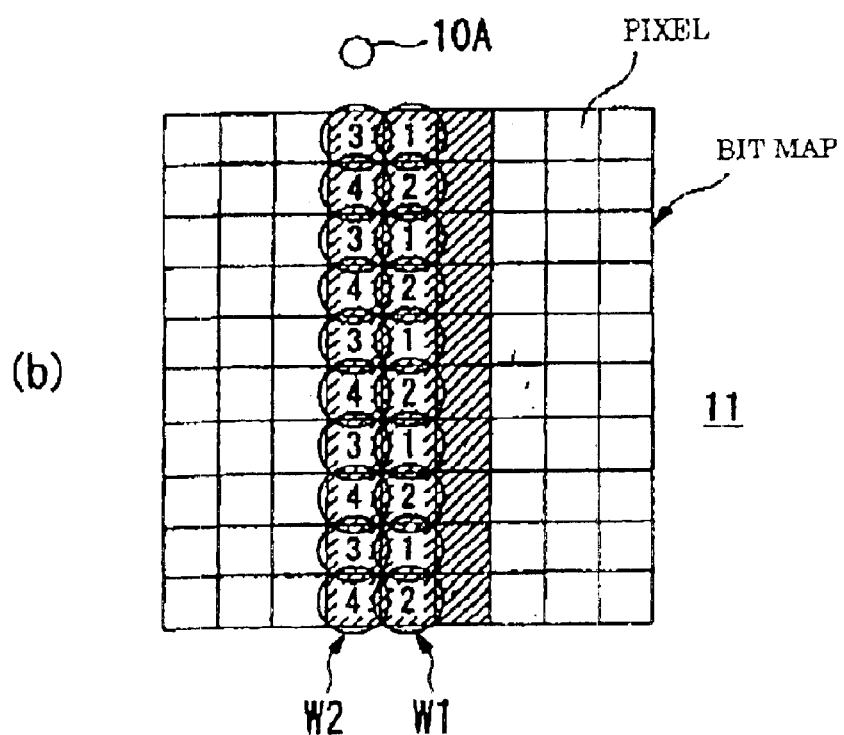

[Fig. 20]
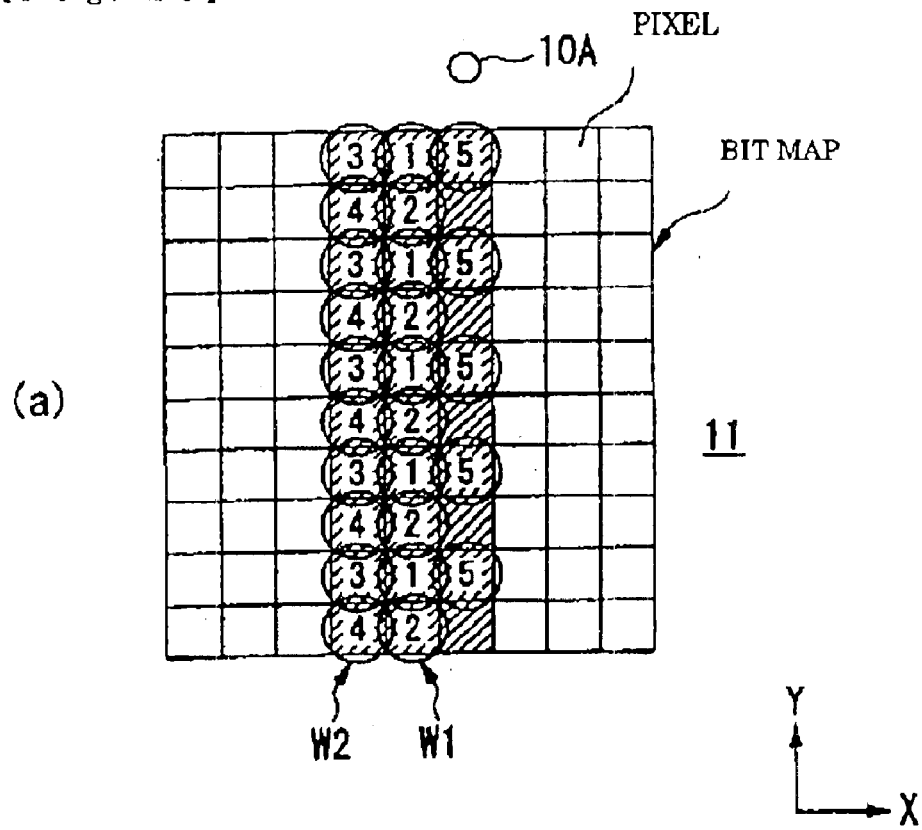
(a)
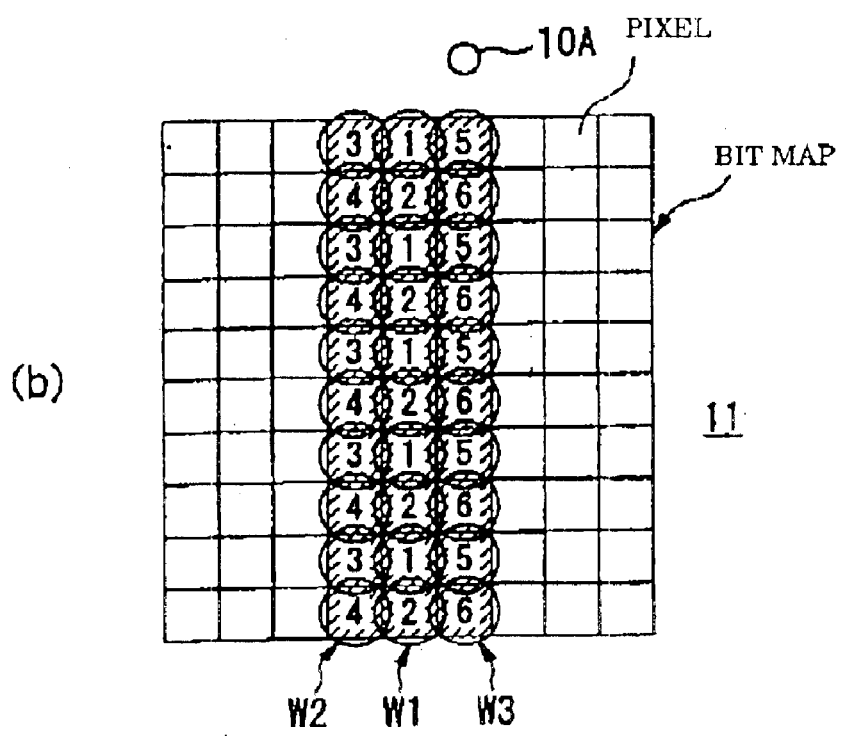
(b)

[Fig. 21]
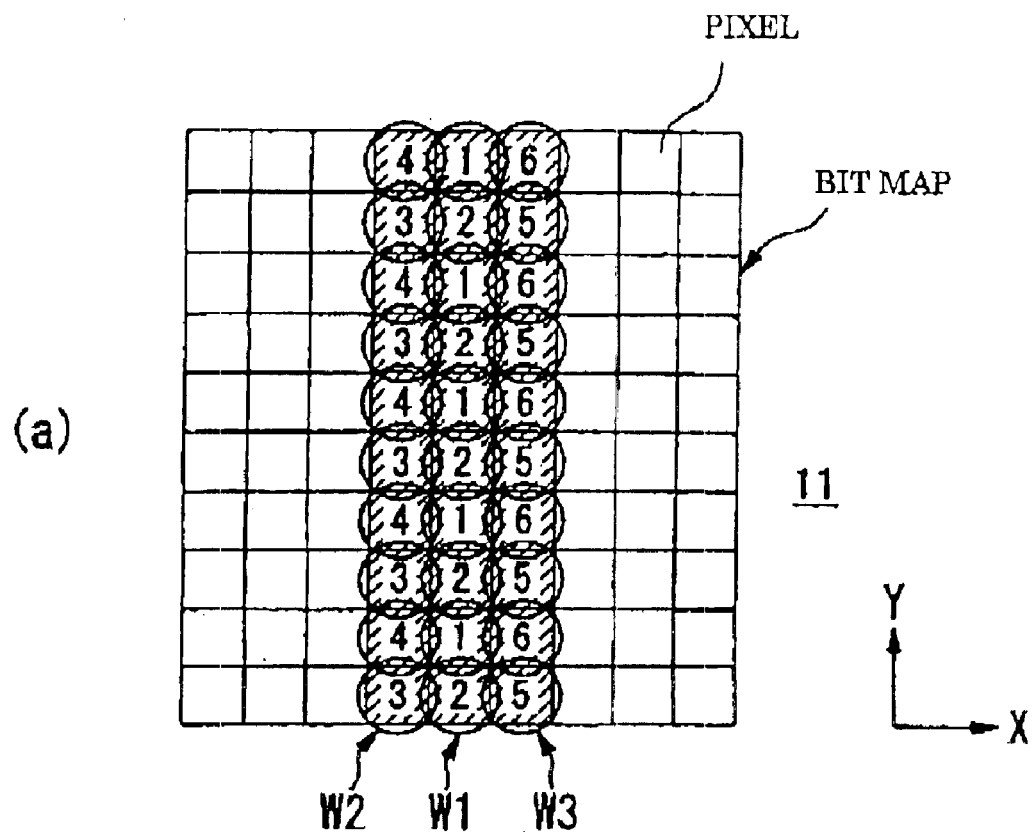

[Fig. 22]
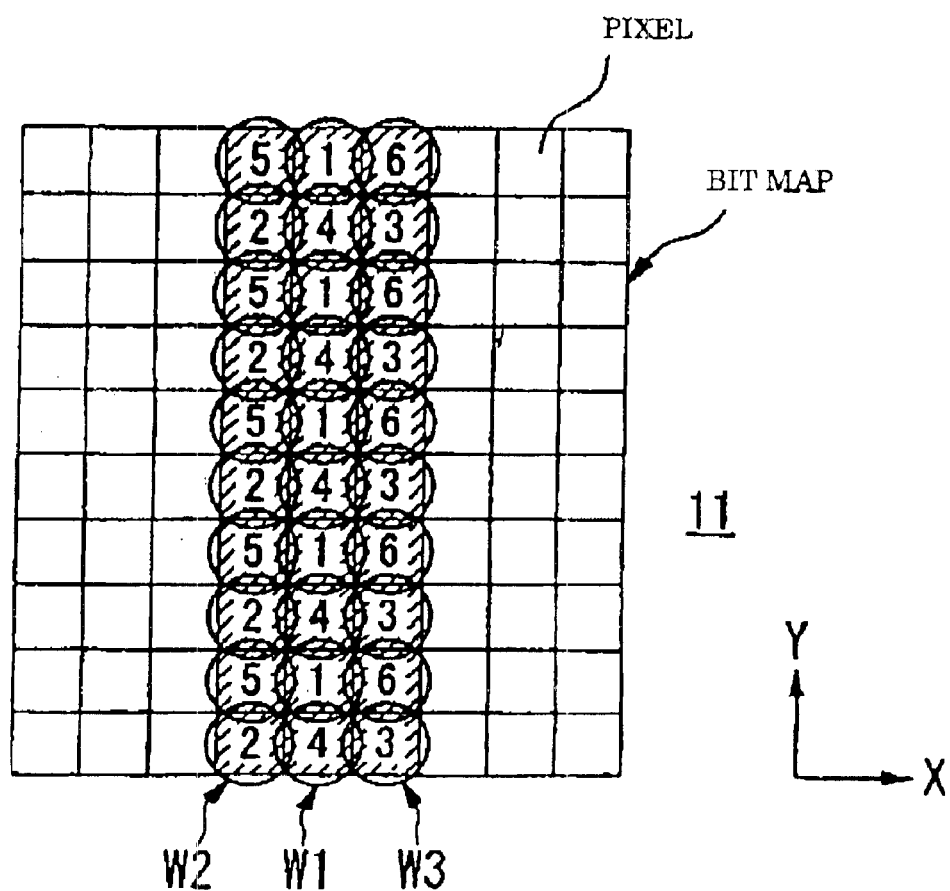

[Fig. 23]
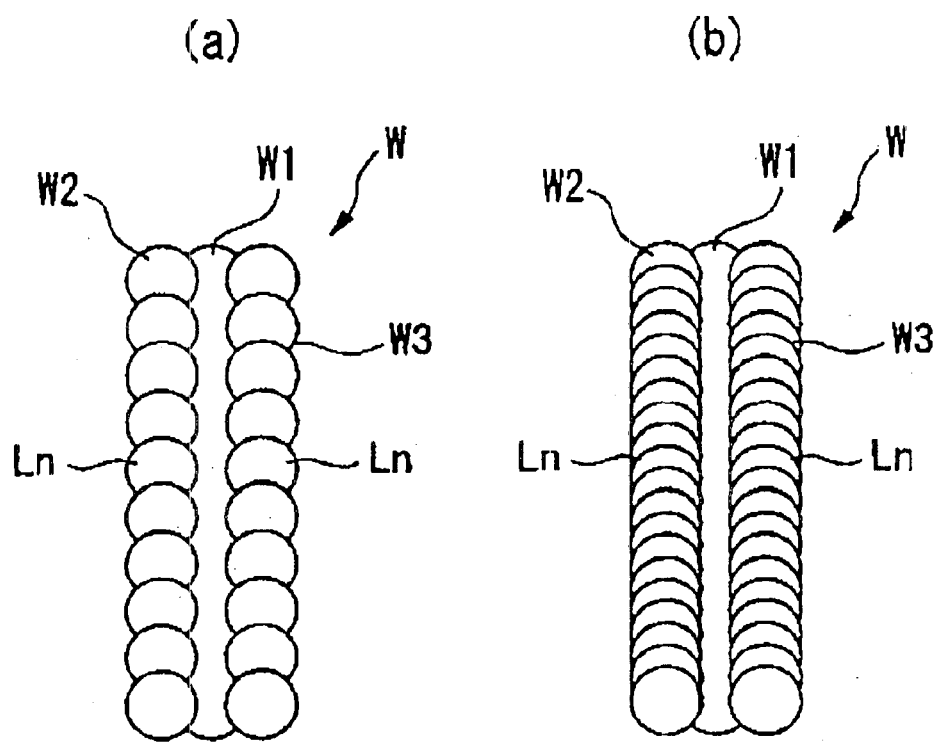

[Fig. 24]
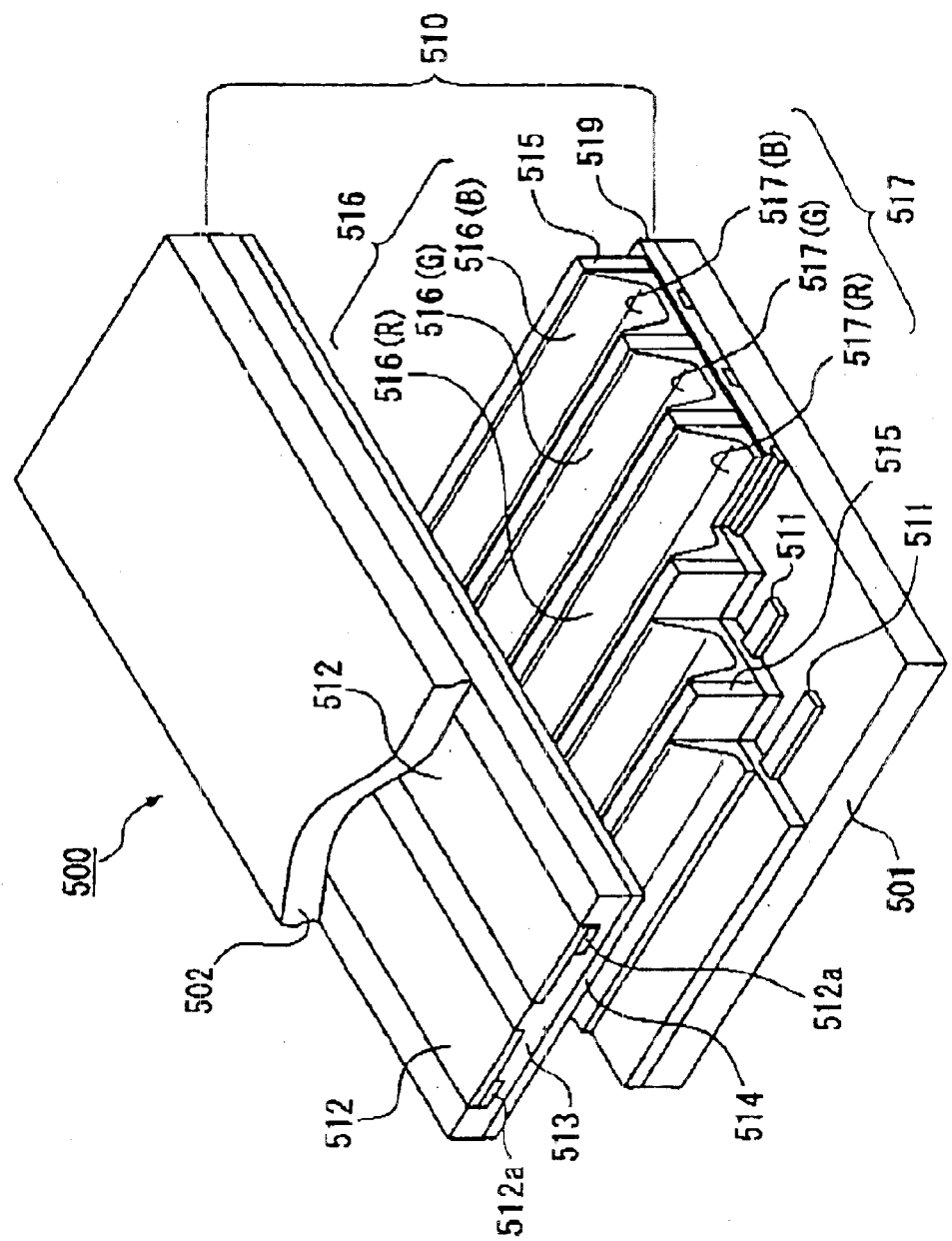

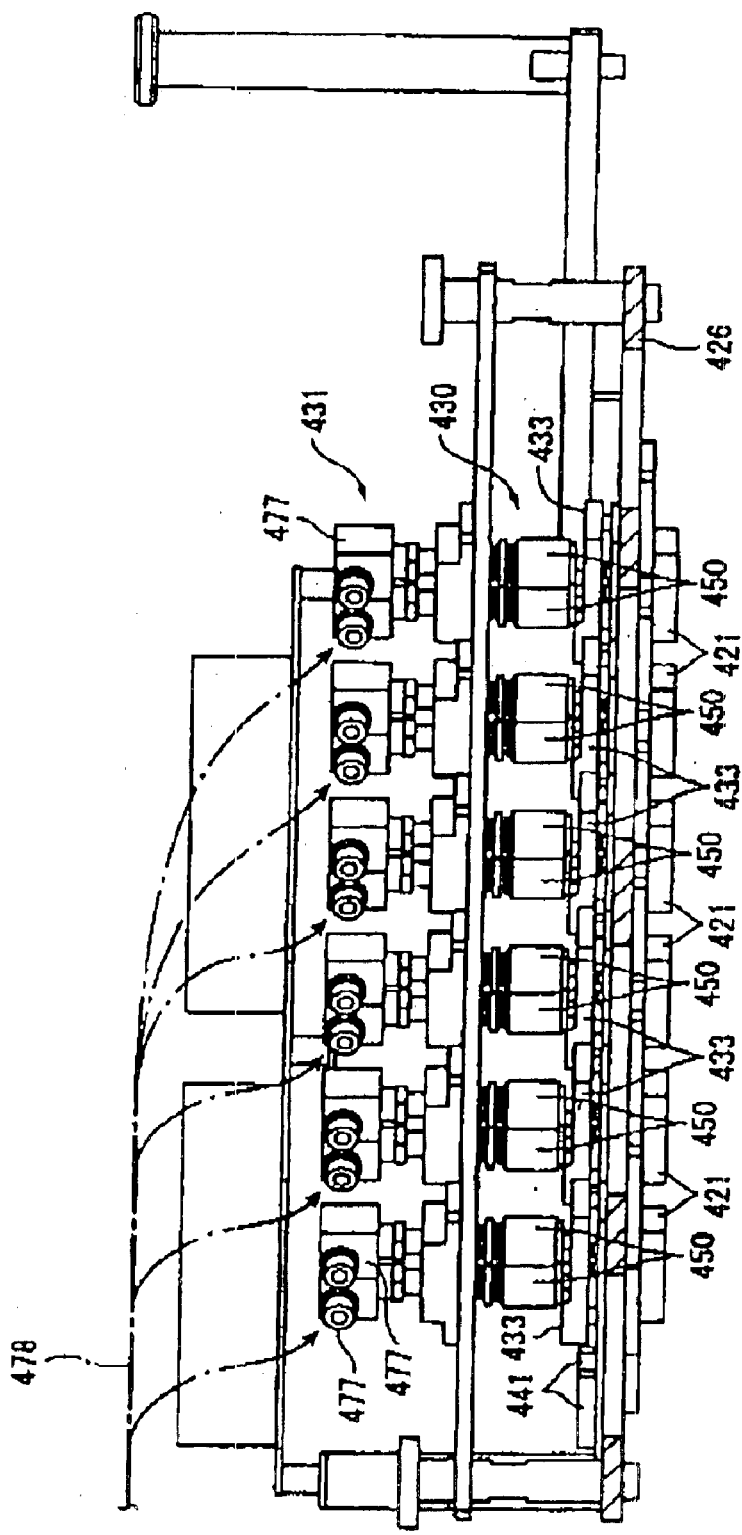
[Fig. 25]

[Fig. 26]
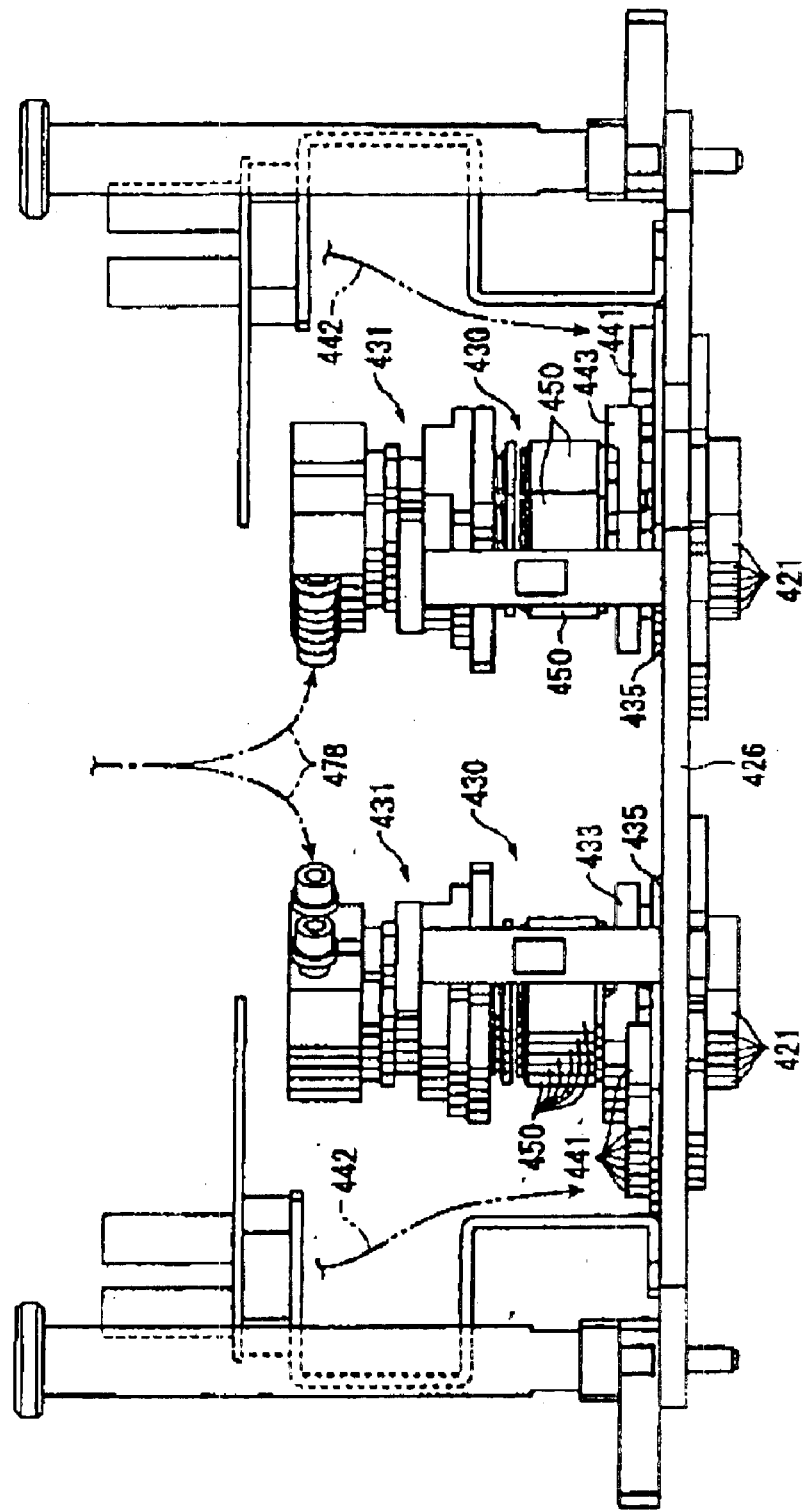

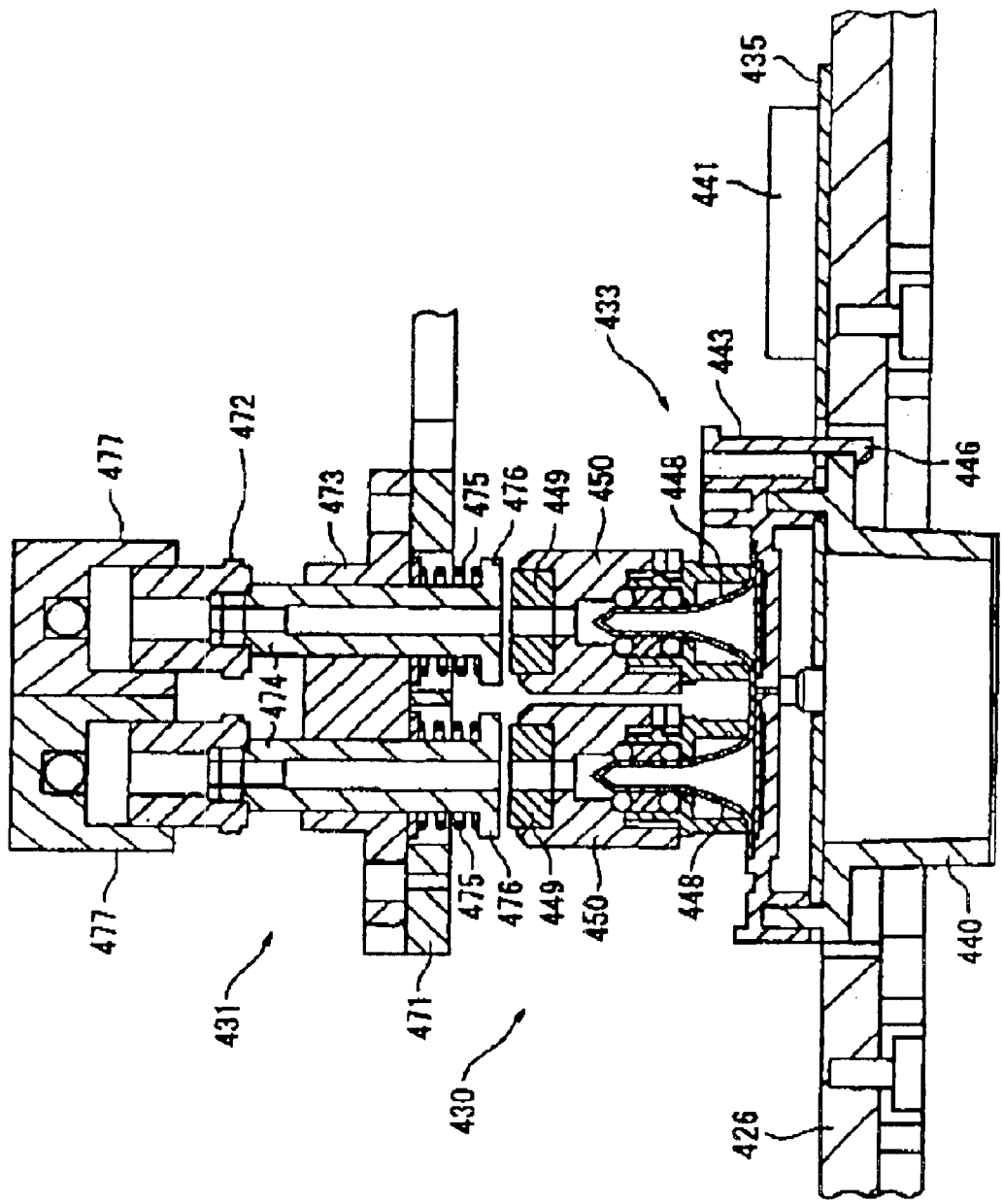
[Fig. 27]

[Fig. 28]
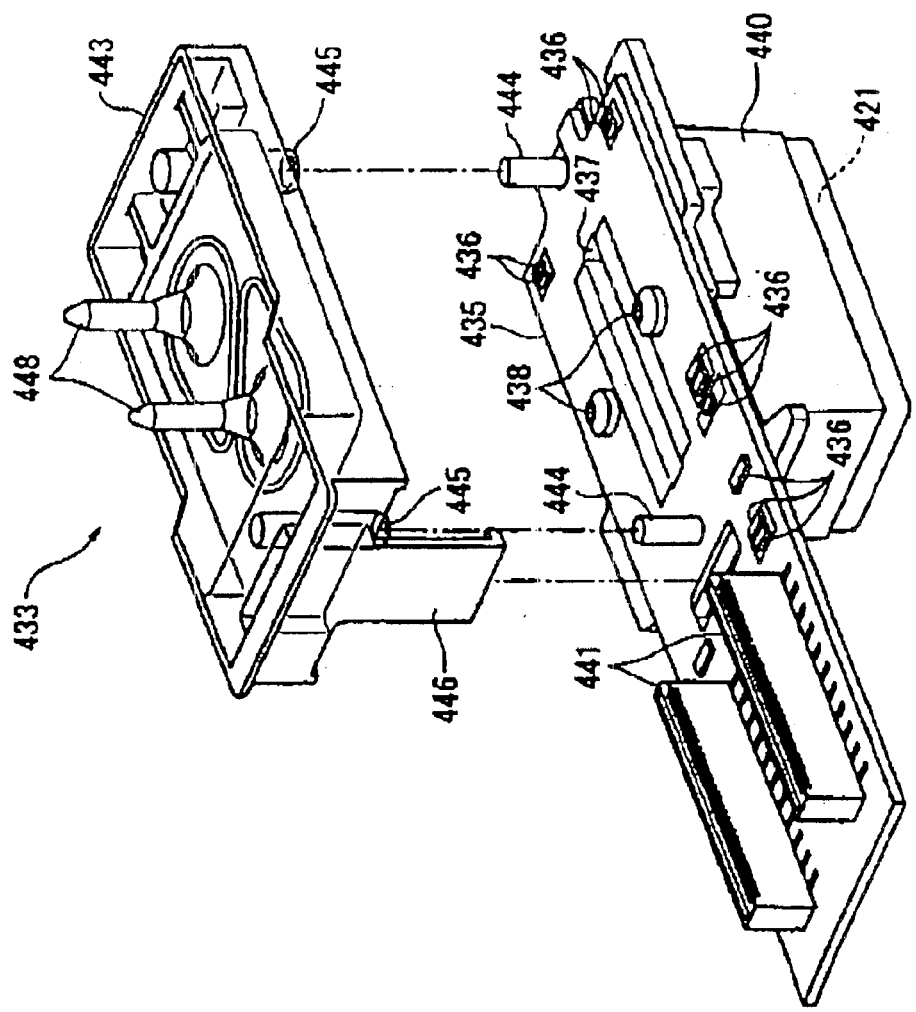

METHOD OF MANUFACTURING ELECTRO-OPTICAL DEVICE, ELECTRO-OPTICAL DEVICE, AND ELECTRONIC APPARATUS

DETAILED DESCRIPTION OF THE INVENTION

1. Technical Field of the Invention

The present invention relates to light-emitting devices and electronic apparatuses, and more particularly, to a light-emitting device provided with an organic electroluminescent material and to an electronic apparatus comprising the light-emitting device.

2. Description of the Related Art

Recently, color light-emitting devices have been developed in which light-emitting elements made of light emitting material such as organic fluorescent material are sandwiched between pixel electrodes (anodes) and cathodes, in particular, an organic electroluminescent (organic EL) device employing organic EL material as the light emitting material. Now, the conventional light-emitting device (the organic EL display element) will be summarized.

FIG. 12 is a view illustrating the wiring structure of the conventional light-emitting device. As shown in FIG. 12, a plurality of scanning lines 901, a plurality of signal lines 902 extending in a direction intersecting the scanning lines 901 and a plurality of power source wiring lines 903 for light emission extending in parallel to the signal lines 902 are arranged in the conventional light-emitting device, and a pixel region A is provided at each intersection of the, scanning lines 901 and the signal lines 902. Each of the signal lines 902 is connected to a data line driving circuit 904 comprising shift registers, level shifters, video lines and analog switches. Each of the scanning lines 901 is connected to a scanning line driving circuit 905 comprising shift registers and level shifters.

Further, each of the pixel regions A is provided with a switching thin film transistor 913 in which a gate electrode is supplied through the scanning lines 901 with scanning signals, a holding capacitor Cap for holding image signals supplied through the switching thin film transistor 913 from the signal lines 902, a current thin film transistor 914 in which a gate electrode is supplied with the image signal held by the holding capacitor Cap, a pixel electrode 911 into which driving current flows from power source wiring lines 903 for light emission when being electrically connected to the power source wiring lines 903 for light emission through the current thin film transistor 914, and a light-emitting layer 910 sandwiched between the pixel electrode 911 and a cathode 912. The cathode 912 is connected to a power source circuit 931 for cathode.

The aforementioned light-emitting layer 910 comprises three types of light-emitting elements: a light-emitting layer 910R emitting a red light, a light-emitting layer 910G emitting a green light and a light-emitting layer 910B emitting a blue light. The respective light-emitting layers 910R, 910G, 910B are arranged in striped shapes. Further, each of power source wiring lines 903R, 903G, 903B for light emission connected respectively to the light-emitting layers 910R, 910G, 910B through the current thin film transistors 914 is connected to a power source circuit 932 for light emission. The power source wiring lines for light emission are arranged for every color, because the driving potentials of the light-emitting layers 910 are different for every color.

In the above constitution, when scanning signals are supplied to the scanning lines 901 to turn on the switching thin film transistors 913, the electric charge corresponding to the image signals supplied to the signal lines 902 at that time is held in the holding capacitors Cap. The ON/OFF state of the current thin film transistors 914 is determined in accordance with the quantity of electric charge held in the holding capacitors Cap. Further, current flows through the current thin film transistors 914 from the power source wiring lines 903R, 903G, 903B for light emission to the pixel electrodes 911, and driving current flows through the light-emitting layer 910 to the cathode 912. At that time, the quantity of emitted light corresponding to that of current flowing through the light-emitting layer 910 is obtained.

PROBLEMS TO BE SOLVED BY THE INVENTION

Meanwhile, in order to have the light-emitting layer 910, which is provided in the light-emitting device as described above, emit light stably, it is required that the variation in electrical potential of driving current being supplied from a power source wiring line 903 for light emission to the pixel electrode 911 be reduced as much as possible. As shown in FIG. 12, however, since the scanning line 901, signal line 902, and the power source wiring line 903 are entangled from one another, parasitic capacitance is generated between the power source wiring line 903 for light emission, the scanning line 903, and the signal line 902. When the parasitic capacitance becomes large, image signals cannot be supplied to a pixel region A in a predetermined period of time. Thereby there is a problem that the deterioration in contrast may occur, so that normal image display cannot be performed.

Further, in the case where the light-emitting device is employed as a light-emitting device in a portable electronic apparatus, for example, a mobile phone, it is required that the light-emitting device have a more broadened area for display and at the same time be miniaturized/light weighted. To comply with both of the requirements, it requires that the display of the light-emitting device should be configured effectively. Further, it requires that the power source wiring line and the cathode wiring lines should be configured in a simpler way.

The present invention has been made in consideration of the above situation, and it is an object of the present invention to provide a light-emitting device and electronic apparatus comprising the light-emitting device, in which the supply of image signals is stabilized by reducing the parasitic capacitance between wiring lines, thereby preventing an abnormal image display such as the deterioration in contrast and allowing the effective use of the display.

MEANS FOR SOLVING THE PROBLEMS

In order to solve the above problems, according to the present invention, in a method of manufacturing an electro-optical device which comprises light-emitting elements each having a light-emitting layer formed between a first electrode and a second electrode, a scanning line providing scanning signals, a signal line formed in a direction intersecting the scanning line, and a power source wiring line for light emission, the method comprises a step of forming the power source wiring line for light emission by applying liquid material including conductive material.

Further, in a method of manufacturing an electro-optical device which comprises light-emitting elements each having a light-emitting layer formed between a first electrode and a second electrode, a scanning line providing scanning signals, a signal line formed in a direction intersecting the scanning line, and a power source wiring line for light emission, the power source wiring line for light emission being formed of a plurality of conductive layers, the method comprises a step of forming at least one layer of the plurality of conductivity layers by applying liquid material including conductive material.

Moreover, the uppermost conductive layer among the plurality of conductive layers is formed by applying liquid material including conductive material.

Furthermore, the liquid material is applied by an inkjet method.

Furthermore, an electro-optical device is formed by any one method of the aforementioned manufacturing methods.

Furthermore, an electronic apparatus comprises the electro-optical device.

DESCRIPTION OF THE EMBODIMENTS

Now, a light-emitting device and an electronic apparatus according to an embodiment of the present invention will be described in detail with reference to the drawings. Further, in order that the respective layers or the respective members have recognizable sizes in the respective drawings which will be referred to in the following description, the respective layers or the respective members are represented in different scales. FIG. 1 schematically illustrates the wiring structure of a light-emitting device according to an embodiment of the present invention.

A light-emitting device 1 shown in FIG. 1 is an active matrix type organic EL device employing thin film transistors as switching elements. The light-emitting device 1 of the present embodiment shown in FIG. 1, has a plurality of scanning lines 101, a plurality of signal lines 102 extending in a direction intersecting the scanning lines 101 and a plurality of power source wiring lines 103 for light emission extending parallel to the signal lines 102, respectively, and a pixel region A is provided at each intersection of the scanning lines 101 and the signal lines 102.

A data line driving circuit 104 comprising shift registers, level shifters, video lines and analog switches is connected to each signal line 102. Further, an inspection circuit 106 comprising thin film transistors is connected to each signal line 102. Furthermore, a scanning line driving circuit 105 comprising shift registers and level shifters is connected to each scanning line 101.

Further, each of the pixel regions A is provided with a switching thin film transistor (first switching element) 112, a holding capacitor Cap, a current thin film transistor (second switching element) 123, a pixel electrode (first electrode) 111, a light-emitting layer 110 and a cathode (second electrode) 12. Moreover, the first switching element and the second switching element are equivalent to the switching element that is referred to in the present invention. The switching thin film transistor 112 whose gate electrode is connected to the scanning line 101, is driven in accordance with scanning signals supplied from the scanning line 101 so as to be turned on or off. The holding capacitor Cap holds image signals supplied from the signal line 102 through the switching thin film transistor 112.

A gate electrode of the current thin film transistor 123 is connected to the switching thin film transistor 112 and the holding capacitor Cap, and the image signal held by the holding capacitor Cap is supplied to the gate electrode. The pixel electrode 111 is connected to the current thin film transistor 123, and when the pixel electrode is electrically connected to the power source wiring line 103 for light emission through the current thin film transistor 123, the driving current flows into the pixel electrode from the power source wiring line 103 for light emission. The light-emitting layer 110 is inserted between the pixel electrode 111 and the cathode 12.

The light-emitting layer 110 formed by at least the above anode, light-emitting device, and cathode, comprises: three types of light-emitting elements of a light-emitting layer 110R emitting a red light, a light-emitting layer 110G emitting a green light and a light-emitting layer 110B emitting a blue light. The respective light-emitting layers 110R, 110G, 110B are arranged in striped shapes. Further, power source wiring lines 103R, 103G, 103B for light emission connected to the respective light-emitting layers 110R, 110G, 110B through the current thin film transistor 123 are connected to a power source circuit 132 for light emission, respectively. The power source wiring lines 103R, 103G, 103B for light emission are arranged for every color, because the driving potentials of the light-emitting layers 110R, 110G, 110B are different for every color.

Further, in the light-emitting device of the present embodiment, first electrostatic capacitors $C_1$ are formed between the cathode 12 and the power source wiring lines 103R, 103G, 103B for light emission. When the light-emitting device 1 is driven, electric charge is accumulated in the first electrostatic capacitors $C_1$. When the potential of the driving current flowing through the respective power source wiring lines 103 for light emission in the course of driving the light-emitting device 1 varies, the accumulated charge is discharged into the respective power source wiring lines 103 for light emission to suppress the variation in driving current. Accordingly, the image display by the light-emitting device 1 can be normally maintained.

Furthermore, in this light-emitting device 1, when the scanning signals are supplied from the scanning lines 101 to turn on the switching thin film transistor 112, the potential of the signal lines 102 at that time is held at the holding capacitors Cap, and the ON/OFF state of the current thin film transistors 123 is determined in accordance with the potential held at the holding capacitors Cap. Further, the driving current flows through channels of the current thin film transistors 123 from the power source wiring lines 103R, 103G, 103B for light emission to the pixel electrodes 111, and current also flows through the light-emitting layers 110R, 110G, 110B to the cathode 12. At this time, a quantity of emitted light corresponding to the quantity of current flowing through the light-emitting layers 110 is obtained from the light-emitting layers 110.

Next, a specific configuration of the light-emitting device 1 according to the present embodiment will be described with reference to FIGS. 2 to 4. FIG. 2 is a schematic plan view of the light-emitting device according to the present embodiment, and FIG. 3 is a cross-sectional view taken along the line A–A' in FIG. 2. FIG. 4 is a cross-sectional view taken along the line B–B' in FIG. 2.

As shown in FIG. 2, the light-emitting device 1 according to the present invention generally comprises a substrate 2, a pixel electrode group region (not shown), power source wiring lines 103 (103R, 103G, 103B) for light emission and a pixel portion 3 (within a frame of a one-dot chain line in the drawing).

The substrate 2 is a transparent substrate, for example, made of glass and the like. The pixel electrode group region is a region in which the pixel electrodes (not shown) connected to the current thin film transistors 123 shown in FIG. 1 are arranged in a matrix on the substrate 2. The power source wiring lines 103 (103R, 103G, 103B) for light emission are arranged around the pixel electrode group region, as shown in FIG. 2, and are connected to the respective pixel electrodes. The pixel portion 3 is positioned at least above the pixel electrode group region and has a substantially rectangular shape in a plan view. This pixel portion 3 is divided into an effective light-emitting region 4 (within a frame indicated two-dot chain line) at the center and a dummy region 5 disposed outside the effective light-emitting region 4 (a region between the one-dot chain line and the two-dot chain line).

Furthermore, the scanning line driving circuits 105 are disposed on both sides of the effective light-emitting region 4 in the drawing. These scanning line driving circuits 105 are provided on the lower side (the substrate 2 side) of the dummy region 5. Further, control signal wiring lines 105a for scanning line driving circuit and power source wiring lines 105b for scanning line driving circuit which are connected to the scanning line driving circuit 105 are provided on the lower side of the dummy region 5. Furthermore, the aforementioned inspection circuit 106 is disposed on the upper side of the effective light-emitting region 4 in the drawing. This inspection circuit 106 is disposed on the lower side (the substrate side 2) of the dummy region 5, and it is possible to inspect the quality or the defect of the light-emitting device during its manufacture or during its shipment by using this inspection circuit 106.

As shown in FIG. 2, the power source wiring lines 103R, 103G, 103B for light emission are disposed around the dummy region 5. Each of the power source wiring lines 103R, 103G, 103B for light emission extends along the control signal wiring lines 105a for the scanning line driving circuit from the lower side of the substrate 2 in FIG. 2 to the upper side in FIG. 2, is bent from a position at which the control signal wiring lines 105a for scanning line driving circuit are stopped, extends along the outside of the dummy region 5, and is connected to the pixel electrodes (not shown) in effective light-emitting region 4. Further, a cathode wiring line 12a connected to the cathode 12 is formed on the substrate 2. This cathode wiring line 12a is formed substantially in a U-shape in a plan view to surround the power source wiring lines 103R, 103G, 103B for light emission.

Further, a polyimide tape 130 is adhered to one end of the substrate 2, and control IC 131 is mounted on the polyimide tape 130. The data line driving circuit 104, the power source circuit 931 for cathode and the power source circuit 132 for light emission, which is shown in FIG. 1, are built in the control IC 131.

Next, as shown in FIGS. 3 and 4, a circuit portion 11 is formed on the substrate 2, and a pixel portion 3 is formed on the circuit portion 11. Further, a sealing material 13 surrounding the pixel portion 3 in a ring shape is formed on the substrate 2, and a sealing substrate 14 is provided in the pixel portion 3. The sealing substrate 14 is adhered to the substrate 2 through the sealing material 13, and is made of glass, metal, resin and the like. An absorbent 15 is adhered to the back surface of the sealing substrate 14 so that water or oxygen doped can be adsorbed into a space between the pixel portion 3 and the sealing substrate 14. Further, a getter may be used instead of the adsorbent 15. Furthermore, the sealing material 13 is made of, for example, thermosetting resin or UV curing resin, and it is preferable that the sealing material be made of, in particular, epoxy resin that is one type of thermosetting resin.

The central portion of the circuit portion 11 is provided with a pixel electrode group region 11a. The pixel electrode group region 11a comprises the current thin film transistors 123 and the pixel electrodes 111 connected to the current thin film transistors 123. The current thin film transistors 123 are formed to be buried in a base protective layer 281, a second interlayer insulating layer 283 and a first interlayer insulating layer 284 which are stacked on the substrate 2, and the pixel electrodes 111 are formed on the first interlayer insulating layer 284. The power source wiring lines 103 (103R, 103G, 103B) for light emission are connected to one sides of electrodes (source electrodes) connected to the current thin film transistors 123 and formed on the second interlayer-insulating film 283. Further, although the holding capacitors Cap and the switching thin film transistors 112 are also formed in the circuit portion 11, these are not shown in FIGS. 3 and 4. Further, the illustration of the signal lines 102 is omitted in FIGS. 3 and 4. Moreover, the illustration of the switching thin film transistor 112 and the current thin film transistor 123 is omitted in FIG. 4.

Next, in FIG. 3, both sides of the pixel electrode group region 11a in the drawing are provided with the aforementioned scanning line driving circuit 105. The scanning line driving circuit 105 shown in FIG. 3 comprises N channel type or P channel type thin film transistors 105c constituting inverters included in the shift registers. The thin film transistors 105c have the same structure as the aforementioned current thin film transistors 123, except that they are not connected to the pixel electrodes 111. Further, although the illustration of the inspection circuit 106 is omitted in FIG. 4, the inspection circuit 106 also comprises thin film transistors, similarly. The thin film transistors included in the inspection circuit 106 have the same structure as the current thin film transistors 123, except that they are not connected to dummy pixel electrodes 111' which will be described later.

As shown in FIG. 3, the control signal wiring lines 105a for scanning line driving circuit are formed on the base protective layer 281 outside the scanning line driving circuit 105 in FIG. 4. Further, as shown in FIG. 4, the scanning lines 104 are formed on the base protective layer 281. Further, the power source wiring lines 105b for scanning line driving circuit are formed on the second interlayer insulating layer 283 outside the control signal wiring lines 105a for scanning line driving circuit. Furthermore, the power source wiring lines 103 for light emission are formed outside the power source wiring lines 105b for scanning line driving circuit. These power source wiring lines 103 for light emission employ a double wiring structure composed of two wiring lines and are arranged outside the pixel portion 3 as described above. By employing the double wiring structure, it is possible to reduce the wire resistance.

For example, the power source wiring line 103R for light emission for red color on the left side in FIG. 3 comprises a first wiring line 103R$_1$ formed on the base protective layer 281 and a second wiring line 103R$_2$ formed on the first wiring line 103R$_1$ through the second interlayer-insulating film 283. The first wiring line 103R$_1$ and the second wiring line 103R$_2$ are connected to each other through a contact hole 103R$_3$ penetrating the second interlayer insulating layer 283 as shown in FIG. 2. As such, the first wiring line 103R$_1$ is formed at the same level position as the cathode wiring line 12a and the second interlayer insulating layer 283 is disposed between the first wiring line 103R$_1$ and the cathode wiring line 12a. Furthermore, as shown in FIGS. 3 and 4, the cathode wiring line 12a is electrically connected to a cathode wiring line 12b formed on the second interlayer insulating layer 283 through a contact hole, and the cathode wiring line 12a also has the double wiring structure. Similarly, the second wiring line 103R$_2$ is formed at the same level position as the cathode wiring line 12b, and the first interlayer insulating layer 284 is disposed between the first wiring line 103R$_2$ and the cathode wiring line 12b. By constituting such structure, second electrostatic capacitors C$_2$ are formed between the first wiring line 103R$_1$ and the cathode wiring line 12a and between the second wiring line 103R$_2$ and the cathode wiring line 12b.

Similarly, the power source wiring lines 103G, 103B for light emission for green color and blue color on the right side in FIG. 3 also employ the double wiring structure and comprise first wiring lines 103G$_1$, 103B$_1$ formed on the base protective layer 281 and second wiring lines 103G$_2$, 103B$_2$ formed on the second interlayer insulating layer 283, respectively. The first wiring lines 103G$_1$, 103B$_1$ and the second wiring lines 103G$_2$, 103B$_2$ are connected to each other through contact holes 103G$_2$, 103B$_2$ penetrating the second interlayer insulating layer 283 as shown in FIGS. 2 and 3. Further, the second electrostatic capacitors C$_2$ are formed between the first wiring line 103B$_1$ for blue color and the cathode wiring line 12a and between the second wiring line 103B$_2$ for blue color and the cathode wiring line 12b.

It is preferable for the gap between the first wiring line 103R$_1$ and the second wiring line 103R$_2$ to be, for example, within a range of 0.6 to 1.0 μm. Because if the gap is less than 0.6 μm, the parasitic capacitance between the source metal and the gate metal having potentials different from the signal lines 102 and the scanning lines 101 increases, it is not preferable for the gap to be less than 0.6 μm. For example, many locations where the source metal and the gate metal intersect each other are in the effective light-emitting region 4, and if the parasitic capacitance at such locations becomes large, it may undesirably cause the time delay of the image signal. As a result, the image signals cannot be written to the pixel electrodes 111 within a predetermined time, which causes deterioration of contrast. It is preferable that the second interlayer insulating layer 283 sandwiched between the first wiring line 103R$_1$ and the second wiring line 103R$_2$ be made of, for example, SiO$_2$ and the like. However, if the second interlayer insulating layer 283 is formed to be 1.0 μm or more thick, it may undesirably cause destruction of the substrate 2 due to stress of SiO$_2$.

Further, the cathode 12 extending from the pixel portion 3 is formed on the upper side of the respective power source wiring lines 103R for light emission. In this regard, the second wiring line 103R$_2$ of the respective power source wiring lines 103R for light emission is disposed to face the cathode 12 sandwiching the first interlayer insulating layer 284 therebetween, and as a result, the aforementioned first electrostatic capacitor C$_1$ is formed between the second wiring line 103R$_2$ and the cathode 12. Here, it is preferable that the gap between the second wiring line 103R$_2$ and the cathode 12 be, for example, within a range of 0.6 to 1.0 μm. If the gap is less than 0.6 μm, the parasitic capacitance between the pixel electrodes and the source metal having different potentials such as the pixel electrodes and the source metal increases, the wire delay is caused in the signal lines employing the source metal. As a result, since the image signals cannot be written within a predetermined time, which causes deterioration in contrast. It is preferable that the first interlayer insulating layer 284 sandwiched between the second wiring line 103R$_2$ and the cathode 12 be made of, for example, SiO$_2$, acryl resin and the like. However, if SiO$_2$ is formed to be a thickness of 1.0 μm or more, the substrate 2 may be destructed due to stress. Further, the acryl resin can be formed to be up to about 2.0 μm thick, but since the acryl resin has a property of expanding by adsorbing water, the pixel electrodes formed thereon may be destroyed undesirably.

As such, in the light-emitting device 1 of this embodiment, since the first electrostatic capacitor C$_1$ is provided between the power source wiring line 103 for light emission and the cathode 12, when the potential of the driving current flowing through the power source wiring line 103 for light emission varies, the electric charge accumulated in the first electrostatic capacitor C$_1$ is supplied to the power source wiring lines 103 for light emission and the lack of potential of the driving current can be complemented by the electric charge to suppress the variation of potential. Accordingly, it is possible to normally maintain the image display of the light-emitting device 1. Specifically, since the power source wiring line 103 for light emission and the cathode 12 are opposed each other outside the pixel portion 3, the gap between the power source wiring lines 103 for light emission and the cathode 12 can be made smaller to increase the quantity of charge accumulated in the first electrostatic capacitor C$_1$, and the variation in potential of the driving current can be made smaller to stably perform the image display. Furthermore, the power source wiring line 103 for light emission have the double wiring structure comprising the first wiring lines and the second wiring lines and the second electrostatic capacitors C$_2$ is provided between the first wiring lines and the cathode wiring line, and thus the charge accumulated in the second electrostatic capacitors C$_2$ is also supplied to the power source wiring line 103 for light emission. Therefore, it is possible to suppress the variation in potential and it is also possible to more stably maintain the image display of the light-emitting device 1.

Now, the structure of the circuit portion 11 including the current thin film transistor 123 will be explained in detail. FIG. 5 is a cross-sectional view showing essential parts of the pixel electrode group region 11a. As shown in FIG. 5, a base protective layer 281 mainly composed of SiO$_2$ is deposited on the surface of the substrate 2, and an island-like silicon layer 241 is formed on the base protective layer 281. Further, the silicon layer 241 and the base protective layer 281 are applied with a gate-insulating layer 282 mainly composed of SiO$_2$ and/or SiN. Further, the silicon layer 241 is formed thereon with a gate electrode 242 through the gate-insulating layer 282.

Further, FIG. 5 shows the cross sectional structure of the current thin film transistor 123, and the switching thin film transistor 112 is also the same structure as that shown in FIG. 5. The gate electrode 242 of the switching thin film transistor 112 is connected to the scanning line 101 shown in FIG. 4. Moreover, the gate electrode 242 and the gate-insulating layer 282 are applied with the second interlayer insulating layer 283 mainly composed of SiO$_2$. In the present specification, the composition "mainly composed of" means a main composition contained in a highest percentage.

Next, in the silicon layer 241, a region facing the gate electrode 242 through the gate-insulating layer 282 is formed as a channel region 241a. Further, in the silicon layer 241, the low concentration source region 241b and high concentration source region 241S are provided in the left side of the channel region 241a in the drawing. The low concentration drain region 241c and high concentration drain region 241D are provided in the right side of the channel region 241a in the drawing, thereby forming so called a light doped drain (LDD) structure. The current thin film transistor 123 is mainly composed of the silicon layer 241.

The high concentration source region 241S is connected to a source electrode 243 formed on the second interlayer insulating layer 283 through the contact hole 244 opened over the gate-insulating layer 282 and the second interlayer insulating layer 283. The source electrode 243 is formed as a part of the aforementioned signal line 102. Meanwhile, the high concentration drain region 241D is connected to a drain electrode 244 formed on the same layer as the source electrode 243 through the contact hole 245 opened over the gate-insulating layer 282 and the second interlayer insulating layer 283.

The first interlayer insulating layer 284 is formed on the second interlayer insulating layer 283 formed with the source electrode 243 and the drain electrode 244. Further, the transparent pixel electrode 111 including ITO, etc. is formed on the first interlayer insulating layer 284 and is connected to the drain electrode 244 through the contact hole 111a formed in the first interlayer insulating layer 284. That is, the pixel electrode 111 is connected to the high concentration drain electrode 241D of the silicon layer 241 through the drain electrode 244. Further, as shown in FIG. 3, the pixel electrode 111 is formed at a position corresponding to the effective light-emitting region 4, but the dummy pixel electrode 111' of the same type as the pixel electrode 111 is formed in the dummy region 5 formed around the effective light-emitting region 4. The dummy pixel electrode 111' is the same type as the pixel electrode 111 except that the dummy pixel electrode is not connected to the high concentration drain electrode 241D.

Next, light-emitting layers 110 and bank portions (insulating portions) 122 are formed in the substantial pixel region 62 of the pixel portion 3. The light-emitting layer 110 is stacked on each of the pixel electrodes 111 as shown in FIGS. 3 to 5. Further, the bank portions 122 are provided between each of the pixel electrodes 111 and the each of the light-emitting layers 110 to define each of the light-emitting layers 110. The bank portion 122 comprises a stacked structure of an inorganic bank layer 122a positioned closely to the substrate 2 and an organic bank layer 122b positioned away from the substrate 2. Further, a light-shielding layer may be disposed between the inorganic bank layer 122a and the organic bank layer 122b.

The inorganic and organic bank layers 122a, 122b are formed to extend onto the edge portion of the pixel electrodes 111, and the inorganic bank layers 122a are formed to extend more toward the centers of the pixel electrodes 111 than the organic bank layers 122b. Further, it is preferable that the inorganic bank layers 122a be made of inorganic material such as, for example, $SiO_2$, $TiO_2$, or SiN. Furthermore, the film thickness of the inorganic bank layers 122a is preferably within a range of 50 to 200 nm and more preferably 150 nm. When the film thickness is less than 50 nm, since the inorganic bank layers 122a become thinner than a hole injecting/carrying layer which will be described later and thus the planarity of the hole injecting/carrying layer cannot be ensured, it is not preferable. Furthermore, when the film thickness is more than 200 nm, since the step height due to the inorganic bank layers 122a increases and thus the planarity of the light-emitting layer (which will be described later) stacked on the hole injecting/carrying layer cannot be ensured. Hence, it is not preferable that the film thickness be more than 200 nm.

Furthermore, the organic bank layers 122b are made of general resists such as acryl resin or polyimide resin. The thickness of the organic bank layers 122b is preferably within a range of 0.1 to 3.5 $\mu$m and more preferably about 2 $\mu$m. If the thickness is less than 0.1 $\mu$m, since the thickness of the organic bank layers 122b is thinner than the total thickness of the hole injecting/carrying layer and the light-emitting layer and thus it is not preferable since the light-emitting layer may overflow undesirably from an upper opening. Furthermore, if the thickness exceeds 3.5 $\mu$m, since the step height due to the upper opening portion increases, and thus it is not preferable since the step coverage of the cathode 12 formed on the organic bank layers 122b cannot be ensured. Furthermore, it is preferable when the thickness of the organic bank layers 122b is 2 $\mu$m or more in that the insulation between the cathode 12 and the pixel electrodes 111 can be improved. In this regard, the light-emitting layers 110 are formed to be thinner than the bank portions 122.

Further, regions having a lyophilic property and regions having a lyophobic property are formed around the bank portions 122. The regions having a lyophilic property are the inorganic bank layers 122a and the pixel electrodes 111, and lyophilic radicals such as hydroxyl are introduced into these regions by means of the plasma treatment using oxygen as a reaction gas. Furthermore, the regions having a lyophobic property are the organic bank layers 122b, and lyophobic radicals such as fluorine are introduced by a plasma treatment using 4-fluoro methane as a reaction gas.

Next, as shown in FIG. 5, the light-emitting layers 110 are stacked on the hole injecting/carrying layers 110a stacked on the pixel electrodes 111. Further, in the present specification, a constitution comprising the light-emitting layers 110 and the hole injecting/carrying layers 110a is referred to as a functional layer, and a constitution comprising the pixel electrodes 111, the functional layer and the cathode 12 is referred to as a light-emitting element. The hole injecting/carrying layers 110a have a function of injecting holes into the light-emitting layers 110 and also a function of carrying the holes in the hole injecting/carrying layers 110a. By providing these hole injecting/carrying layers 110a between the pixel electrodes 111 and the light-emitting layers 110, characteristics of the element such as the light-emitting efficiency or the life time of the light-emitting layers 110 are improved. Further, in the light-emitting layers 110, the holes injected from the hole injecting/carrying layers 110a and electrons from the cathode 12 are coupled to generate a fluorescent light. The light-emitting layers 110 have three types of a light-emitting layer including a light emitting layer for emitting a red (R) light, a light-emitting layer for emitting a green (G) light and a light-emitting layer for emitting a blue (B) light, and as shown in FIGS. 1 and 2, the respective light-emitting layers are arranged in a striped shape.

Next, as shown in FIGS. 3 and 4, dummy light-emitting layers 210 and dummy bank portions 212 are formed in the dummy region 5 of the pixel portion 3. The dummy bank portion 212 has a stacked structure of dummy inorganic bank layers 212a positioned close to the substrate 2 and dummy organic bank layers 212b positioned away from the substrate 2. The dummy inorganic bank layers 212a are formed on the whole surface of the dummy pixel electrodes 111'. Furthermore, the dummy organic bank layers 212b are formed between the pixel electrodes 111, similar to the organic bank layers 122b. Further, the dummy light-emitting layers 210 are formed on the dummy pixel electrodes 111' through the dummy inorganic bank layers 212a.

The dummy inorganic bank layers 212a and the dummy organic bank layers 211b are made of the same material as the aforementioned inorganic and organic bank layers 122a, 122b and have the same film thickness as the aforementioned inorganic and organic bank layers 122a, 122b. Furthermore, the dummy light-emitting layers 210 are stacked on dummy hole injecting/carrying layers (not shown), and the material or the film thickness of the dummy hole injecting/carrying layers and the dummy light-emitting layers is the same as the aforementioned hole injecting/carrying layers 110a and the light-emitting layers 110. Therefore, similar to the aforementioned light-emitting layers 110, the dummy light-emitting layers 210 are formed to be thinner than the dummy bank portions 212.

By disposing the dummy region 5 around the effective light-emitting region 4, it is possible to make the thickness of the light-emitting layers 110 in the effective light-emitting region 4 uniform. Thus it is possible to suppress the non-uniformity of display. That is, by disposing the dummy region 5, it is possible to make the uniform drying condition of ink composition ejected in forming a display element using the inkjet method in the effective light-emitting region 4, and thus it is needless to worry about the deviation in light-emitting layers 110 being rendered in the edge portions of the effective light-emitting region 4.

Next, the cathode 12 is formed on the whole surfaces of the effective light-emitting region 4 and the dummy region 5, extends onto the substrate 2 outside the dummy region 5, and is disposed to face the power source wiring line 103 for light emission outside the dummy region 5, that is, outside the pixel portion 3. Further, an end of the cathode 12 is connected to the cathode wiring line 12a formed in the circuit portion 11. The cathode 12 serves for making a current flow in the light-emitting layers 110 as electrodes opposite to the pixel electrodes 111. This cathode 12 has a stacked structure composed of, for example, a cathode layer 12b which is a stacked body of lithium fluoride and calcium, and a reflecting layer 12c. In the cathode 12, only the reflecting layer 12c extends to the outside of the pixel portion 3. Since the reflecting layer 12c reflects the light emitted from the light-emitting layers 110 toward the substrate 2, it is preferable that the reflecting layer 12c be made of, for example, Al, Ag, Mg/Ag stacked body, etc. Furthermore, an oxidation-preventing protective layer made of $SiO_2$, SiN, etc. may be formed on the reflecting layer 12c.

Herein, as shown in FIG. 4, the scanning line 101 formed on the base passivation layer 281 is positioned at a lower side of the dummy bank portion 212 and further the bank portion 212. Accordingly, the parasitic capacitance between the scanning line 101 and the cathode 12 can decrease by widening an interval therebetween.

The above embodiment is remarkably effective in minimizing the parasitic capacitance between the scanning line 101 and the cathode 12 since a plurality of interlayer insulating layers (a second interlayer insulating layer 283 and a first interlayer insulating layer 284) and the bank portion 212 are positioned between the scanning line 101 and the cathode 12, and the interval between the scanning line 101 and the cathode 12 can be widen. Since the time delay of the scanning signals inputted to the scanning line 101 can be suppressed by minimizing the parasitic capacitance, the image signal can be written into the pixel electrode 111 within a predetermined time, to thereby prevent the contrast of the image from being deteriorated.

Now, a method for manufacturing the light-emitting device 1 according to this embodiment will be described. FIGS. 6 to 9 are views illustrating steps of manufacturing the light-emitting device according to an embodiment of the present invention. Referring first to FIGS. 6 to 8, a method of forming the circuit portion 11 on the substrate 2 will be described. Also, respective cross-sectional views of FIGS. 6 to 8 correspond to a sectional view taken along the line A–A' in FIG. 2. Further, the impurity concentration described below is the concentration of impurity after being subjected to the anneal-treatment for activation.

First, as shown in FIG. 6(a), the base protective layer 281 made of silicon oxide film or the like is formed on the substrate 2. Then, after an amorphous silicon layer is formed on the base passivation layer 281 by the ICVD method, the PECVD method and the like, the amorphous silicon layer is grown to a polysilicon layer 501 by growing crystal grains through the laser annealing method and the rapid heating method. Further, as shown in FIG. 6(b), the polysilicon layer 501 is patterned by the photolithographic method, thereby forming island-like silicon layers 241, 251 and 261. Further, a gate-insulating layer 282 made of silicon oxide is formed on the island-like silicon layers 241, 251 and 261.

The silicon layer 241 constitutes a current thin film transistor 123 (hereinafter, referred to as TFT for pixel) formed at a position corresponding to the effective light-emitting region 4 and connected to the pixel electrode 111. The silicon layers 251 and 261 each constitute a P-channel type thin film transistor and an N-channel type thin film transistor (hereinafter, sometimes referred to as TFT for driving-circuit) in the scanning line driving circuit 105.

The gate-insulating layer 282 is formed by forming a silicon oxide film having a thickness of about 30 to 200 nm through PECVD method, the thermal oxidation method and the like so as to cover the island-like silicon layers 241, 251 and 261 and the base passivation layer 281. Herein, when the gate-insulating layer 282 is formed through the thermal oxidation method, the island-like silicon layers 241, 251 and 261 can be also crystallized so that they are formed into a polysilicon layer. In the case of performing a channel-doping, boron ions are implanted into the island-like silicon layers 241, 251 and 261 in a dose of about $1 \times 10^{12}$ cm$^{-2}$. As a result, the island-like silicon layers 241, 251 and 261 are formed into a low concentration P type silicon layer having an impurity concentration of about $1 \times 10^{-17}$ cm$^{-3}$.

Next, as shown in FIG. 6(c), after an ion implantation/selection mask $M_1$ is formed on a part of the island-like silicon layers 241 and 261, the phosphorous ions are implanted into the island-like silicon layers 241 and 261 in a dose of about $1 \times 10^{15}$ cm$^{-2}$ through the ion implantation/selection mask $M_1$. As a result, high concentration impurities are introduced into the island-like silicon layers 241 and 261 through the ion implantation/selection mask $M_1$ in a self-alignment manner, to thereby form high concentration source regions 241S and 261S and high concentration drain regions 241D and 261D in the island-like silicon layers 241 and 261.

Next, as shown in FIG. 6(d), after the ion implantation/selection mask $M_1$ is removed, a doped silicon silicide film, or a metallic film such as a aluminum film, a chrome film or a tantalum film having a thickness of about 200 nm is formed on the gate-insulating layer 282. Further, a metallic film is patterned to form a gate electrode 252 of a P-channel type TFT for driving-circuit, a gate electrode 242 of a TFT for pixel, and a gate electrode 262 of a N-channel type TFT for driving-circuit. Further, control signal wiring lines 105a for the scanning line driving circuit, first power source wiring lines for light emission $103R_1$, $103G_1$ and $103B_1$, and a part of cathode wiring 12a are simultaneously formed by the patterning. Further, liquid material containing conductive fine particles (metallic particle) can be applied to the substrate by the inkjet method, thereby forming the power source wiring lines for R, G and B color filters and a part of the cathode wiring 12a. The wiring forming method according to the inkjet method will be described later.

Further, phosphorous ions are implanted into the island-like silicon layers 241, 251 and 261 in a dose of $4 \times 10^{13}$ cm$^{-2}$ through the gate electrodes 242, 252 and 262 as masks. As a result, low concentration impurities are introduced into the gate electrodes 242, and 252 and 262 in a self-alignment manner, so that, as shown in FIG. 6(d), low concentration source regions 241b and 261b and low concentration drain regions 241c and 261c are formed in the island-like silicon layers 241 and 261. Further, the low concentration impurity regions 251S and 251D are formed in the island-like silicon layer 251.

Next, as shown in FIG. 7(a), an ion implantation/selection mask $M_2$ is formed on the whole surface of the substrate except for the peripheral area of the gate electrode 252. Boron ions are implanted into the island-like silicon layer 251 in a dose of $1.5 \times 10^{15}$ cm$^{-2}$ through the ion implantation/selection mask $M_2$. As a result, the gate electrode 252 also functions as the mask, and high concentration impurities are doped into the island-like silicon layer 251 in a self-alignment manner, so that regions 251S and 251D are counter-doped to form the source and drain regions of the P-channel type TFT for driving-circuit.

As shown in FIG. 7(b), after the ion implantation/selection mask $M_2$ is removed, a second interlayer insulating layer 283 is formed on the whole surface of the substrate 2. Further, the second interlayer insulating layer 283 is patterned through the photolithographic method to form contact holes $H_1$ at the positions corresponding to the source electrode, drain electrode and cathode wiring 12a of each of the TFTs. Next, as shown in FIG. 7(c), a conductive layer 504 made of metals such as aluminum, chrome or tantalum and having a thickness of 200 to 800 nm is formed on the entire surface of the second interlayer insulating layer 283 having the contact holes $H_1$ so as to cover the second interlayer insulating layer 283, so that metal is buried into the previously formed holes $H_1$ to form contact holes. Furthermore, a patterning mask $M_3$ is formed on the conductive layer 504.

Next, as shown in FIG. 8(a), the conductive layer 504 is patterned with the patterning mask $M_3$ to form the source electrodes 243, 253 and 263, the drain electrodes 244 and 254, the second wiring $103R_2$, $103G_2$ and $103B_2$ of the respective power source wiring line for light-emitting, the power source wiring line 105b for scanning line driving circuit, and the cathode wiring 12a. As described above, the first wiring $103R_1$ and $103B_1$ are formed away from each other in the same layer as the cathode wiring 12a, and the second wiring $103R_2$ and $103B_2$ are formed away from in the same layer as the cathode wiring 12b, thereby to form a second electrostatic capacitance $C_2$.

Also, the inkjet method can be applied to the above process. That is, liquid material containing conductive fine particles (metallic particles) can be applied to form a part of the cathode wiring 12b and the power source wiring lines (for R, G, B color filters). The forming method using the inkjet method will be described later.

When the aforementioned steps are completed, as shown in FIG. 8(b), a first interlayer insulating layer 284, which covers the second interlayer insulating layer 283 is formed of resin material such as acrylic material. It is preferable that the first interlayer insulating layer 284 be formed to have a thickness of about 1 to 2 μm. Next, as shown in FIG. 8(c), a portion of the first interlayer insulating layer 284 corresponding to the drain electrode 244 of the TFT for pixel is removed by etching, thereby forming a contact hole $H_2$ in the first interlayer insulating layer 284. Concurrently with this, the first interlayer insulating layer 284 on the cathode wiring 12a is also removed. As a result, a circuit portion 11 is formed on the substrate 2.

Next, the procedure for obtaining the light-emitting device 1 by forming the pixel portion 3 on the circuit portion 11 will be described with reference to FIG. 9. The cross-sectional view shown in FIG. 9 corresponds to the cross-sectional view taken along the line A–A' in FIG. 2. First, as shown in FIG. 9(a), a thin film made of transparent electrode material such as ITO is formed on the whole surface of the substrate 2. Then, the thin film is patterned to bury the contact hole $H_2$ provided in the first insulating layer 284, thereby to form a contact hole 111a and to form a pixel electrode 111 and a dummy pixel electrode 111'. The pixel electrode 111 is formed only in a formation portion of the current thin film transistor 123, and the pixel electrode 111 is connected to the current thin film transistor (switching element) 123 through the contact hole 111a. Further, the dummy electrode 111' is disposed in an island shape.

Next, as shown in FIG. 9(b), an inorganic bank layer 122a and a dummy inorganic bank layer 212a are formed on the first interlayer insulating layer 284, the pixel electrode 111 and the dummy pixel electrode 111'. The inorganic bank layer 122a is formed in such a manner to open a part of the pixel electrode 111, and the dummy inorganic bank layer 212a is formed to cover the whole dummy pixel electrode 111'. Herein, it should be noted that the inorganic bank layer 122a and the dummy inorganic bank layer 212a are formed at the upper side of the scanning line 101 in the cross-section taken along the line B–B' in FIG. 2. The inorganic bank layer 122a and the dummy inorganic bank layer 212a are obtained by forming an inorganic film such as $SiO_2$, $TiO_2$, or SiN on the whole surface of the pixel electrode 111 and the first interlayer insulating layer 284 by the CVD method, the TEOS method, the sputtering method or the deposition method, and thereafter patterning the inorganic film.

Further, as shown in FIG. 9(b), an organic bank layer 122b and a dummy organic bank layer 212b are formed on the inorganic bank layer 122a and the dummy inorganic bank layer 212a. The organic bank layer 122b is formed in such a manner to open a part of the pixel electrode 111 through the inorganic bank layer 122a, and the dummy organic bank layer 212b is formed in such a manner to open a part of the dummy inorganic bank layer 212a. Accordingly, the bank portion 122 is formed on the first interlayer insulating layer 284.

Subsequently, a region having a lyophilic property and a region having a lyophobic property are formed on the surface of the bank portion 122. In this embodiment, the respective regions are formed through the plasma treatment step. Specifically, the plasma treatment step comprises at least the steps of providing a lyophilic property to the pixel electrode 111, the inorganic bank layer 122a and the dummy inorganic bank layer 212a, and providing a lyophobic property to the organic bank layer 122b and the dummy organic bank layer 212b.

That is, the bank portion 122 is heated to a predetermined temperature of, for example, about 70 to 80° C., and then subjected to a plasma treatment using a reaction gas of $O_2$ in an atmosphere as a lyophilic processing step. Subsequently, the bank portion 122 is subjected to the plasma treatment using the reaction gas of $CF_4$ in the atmosphere as the lyophilic processing step. The bank portion 122 heated for the plasma treatment is cooled down to the room temperature to provide the lyophilic property and the lyophilic property to a predetermined portion of the bank portion 122.

Furthermore, a light-emitting layer 110 and a dummy light-emitting layer 210 are respectively formed on the pixel electrode 111 and the dummy inorganic bank layer 212a by the inkjet method. The light-emitting layer 110 and the dummy light-emitting layer 210 are formed by ejecting and drying a composition ink containing an hole injecting/carrying layer material, and thereafter ejecting and drying a composition ink containing the light-emitting layer material. Further, the light-emitting layer 110 and the dummy light-emitting layer 210 are exposed to an atmosphere of inert gas such as nitrogen or argon, to prevent the hole injecting/carrying layer and the light-emitting layer from being oxidized.

Next, as shown in FIG. 9(c), the cathode 12 is formed to cover the bank portion 122, the light-emitting layer 110 and the dummy light-emitting layer 210. The cathode 12 is obtained by, after forming a cathode layer 12b on the bank portion 122, the light-emitting layer 110 and the dummy light-emitting layer 210, covering the cathode layer 12b and forming a reflecting layer 12c to be connected to the cathode wiring 12a on the substrate 2. As described above, by causing the reflecting layer 12c to extend from the pixel portion 3 onto the substrate 2 to connect the reflecting layer 12c to the cathode wiring 12a, the reflecting layer 12c is disposed to the power source wiring line 103 for light emission through the first interlayer insulating layer 284, and the first electrostatic capacitance $C_1$ is formed between the reflecting layer 12c (cathode) and the power source wiring line 103 for light emission. Lastly, a sealing material 13 such as epoxy resin is applied to the substrate 2, and a sealing substrate 14 is joined to the substrate 2 through the sealing material 13. As a result, the light-emitting device 1 as shown in FIGS. 1 to 4 is obtained.

By assembling electronic components such as the light-emitting device manufactured like the above, a main board having a central processing unit (CPU) or etc., a keyboard, and a hard disk, into a case, for example, a notebook type personal computer (electronic apparatus) 600 shown in FIG. 10 is manufactured. FIG. 10 is a view illustrating an example of an electronic apparatus having a light-emitting device according to an embodiment of the present invention. Further, in FIG. 10, a reference numeral 601 indicates a case, a reference numeral 602 indicates a light-emitting device, and a reference numeral 603 indicates a keyboard. FIG. 11 is a perspective view illustrating a mobile phone as another electronic apparatus. The mobile phone 700 shown in FIG. 11 has an antenna 701, a receiver 702, a transmitter 703, a light-emitting device 704, and a manipulation button part 705.

Further, although the aforementioned embodiment is described by illustrating a notebook computer and a mobile phone as an electronic apparatus, it is not limited to them, but it can be applied to electronic apparatuses such as a projector, a multimedia adaptive personal computer (PC), an engineering workstation (EWS), a pager, a word processor, a television, a view finder type or monitor direct view type videotape recorder, an electronic notebook, an electronic desk calculator, a car navigation device, a POS terminal, an apparatus provided with a touch panel, and the like.

Hereinafter, a method of applying liquid material including conductive material by the inkjet method and of forming cathode wiring lines for connecting power source wiring lines for light emission to cathodes will be described below.

In this example, a dispersion solution (a liquid state material) obtained by dispersing conductive fine particles in a dispersion medium is used as the liquid material for cathode wiring lines (hereinafter referred also to electrical conduction film wiring line) for connecting power source wiring lines for light emission to cathodes, and it is not important whether it is water-based or oil-based. The conductive fine particles used herein are a conductive polymer or superconductor file particles, in addition to metal particles containing at least one kind selected from the group consisting of gold, silver, copper, palladium and nickel. These conductive fine particles may be used after coating the organic material and the like on the surface thereof, in order to improve the dispersibility. The coating material to be applied on the surface of the conductive fine particles may include organic solvent such as xylene, toluene, and citric acid and the like.

It is preferable that the diameter of the conductive fine particles be 1 nm or more and 0.1 $\mu$m or less. Specifically, it is more preferable that the particle diameter be 5 nm or more and 0.1 $\mu$m or less. If the particle diameter is bigger than 0.1 $\mu$m, nozzles of a liquid droplet ejecting head may be blocked undesirably. On the other hand, if the particle diameter is smaller than 5 nm, the volume ratio of the coating material to the conductive fine particles becomes bigger, and thus the ratio of organic material in the obtained film becomes too bigger.

It is preferable that a dispersion medium whose vapor pressure be 0.001 mmHg or more and 200 mmHg or less (about 0.133 Pa or more and 26600 Pa or less) at the room temperature be used as the dispersion medium of the solution containing the conductive fine particles. If the vapor pressure is higher than 200 mmHg, the dispersion medium is vaporized rapidly after ejection and thus it is difficult to form a good film. Further, it is more preferable that the vapor pressure of the dispersion medium be 0.001 mmHg or more and 50 mmHg or less (about 0.133 Pa or more and 6650 Pa or less). If the vapor pressure is more than 50 mmHg, the blocking of nozzle due to rapid drying can occur easily when ejecting the liquid droplets by using the inkjet method. On the other hand, if the vapor pressure of the dispersion medium at the room temperature is 0.001 mmHg or less, the dry is slow and the dispersion medium can easily remain in the film. Thus that it is difficult to obtain a good conductive film after a heat/light treatment that is a subsequent process.

The dispersion medium is not specifically limited, if it can disperse the aforementioned conductive fine particles and does not cause aggregation. For example, in addition to water, alcohols such as methanol, ethanol, propanol, butanol, etc., hydrocarbon group compounds such as n-heptane, n-octane, decane, toluene, xylene, cimen, durene, inden, dipentene, tetrahydronaphthalene, decahydronaphthalene, cyclohexylbenzene, etc., ether group compounds such as ethyleneglycoldimethylether, ethyleneglycoldiethylether, ethyleneglycolmethylethylether, diethyleneglycoldimethylether, diehyleneglycoldiethylether, diethyleneglycolmethylethylether, 1,2-dimethoxyehtane, bis(2-methoxyethyl)ether, p-dioxane, etc., and polar compounds such as prophylene carbonate, γ-buthylolactone, N-methyl-2-pyrrolidone, dimethylformamide, dimethylsulphoxide, cyclohexanone, etc. can be exemplified as a dispersion medium. Among these, in view of dispersibility of particles, stability of dispersion solution and facilitation of application to the inkjet method, it is preferable that water, alcohols, hydrocarbon group compounds and ether group compounds be used as the dispersion medium, and it is more preferable that water and hydrocarbon group compounds be used as the dispersion medium. These dispersion mediums may be used separately or in a mixture of two kinds or more.

It is preferable that the concentration of the dispersion solute when the conductive fine particles are dispersed in the dispersion medium be 1 mass % or more and 80 mass % or less, and be adjusted in accordance with the film thickness of a desired conductive film. Further, when the concentration exceeds 80 mass %, the aggregation is apt to occur which makes it difficult to obtain a uniform film.

It is preferable that the surface tension of the dispersion solution of the conductive fine particles be within a range of 0.02 N/m or more and 0.07 N/m or less. When the surface tension in ejecting liquid by the inkjet method is less than 0.02 N/m, since the wettability of the ink compositions to the nozzle surfaces increases, the fly bending can easily occur. When the surface tension exceeds 0.07 N/m, since the shape of meniscus at the front ends of the nozzles is not stable, it is difficult to control the quantity of ejection or the ejection timing.

In order to control the surface tension, a small amount of control agent for surface tension such as fluorine group, silicone group, or non-ionic group may be added to the dispersion solution within a range where the contact angle to the substrate is largely decreased. The non-ionic group control agent for surface tension enhances the wettability of liquid to the substrate and improves a leveling property of film, thereby to help prevent fine unevenness from occurring in the film. The dispersion solution may contain organic compounds such as alcohol, ether, ester, or ketone, as needed.

It is preferable that the viscosity of the dispersion solution be 1 mPa·s or more and 50 mPa·s or less. When the liquid material is ejected as liquid droplets using the inkjet method, if the viscosity is less than 1 mPa·s, the periphery portion of nozzles can be easily contaminated, and if the viscosity is more than 50 mPa·s, the frequency of blocking in the nozzle holes increases, so that it is difficult to eject the liquid droplets smoothly.

Now, examples of using metal particles will be described.

A liquid in which xylene is added to a gold particle dispersion solution (product name "Perfect Gold" made by vacuum Metallurgy Co.) in which gold particles having a diameter of 10 nm are dispersed in toluene and the viscosity thereof is 3 cp, was used. At that time, the aforementioned liquid was applied to regions (flat portions of terminals) formed between the convex portions using the inkjet method. Then, a metal thin film made of gold is formed on the flat portions of terminal portions and at least portions of the convex portions with the flat surfaces.

As an inkjet apparatus (may be referred to as a liquid applicator) used in the inkjet method, the apparatus, for example, shown in FIG. 13 can be used.

The inkjet apparatus comprises an inkjet head group 1, an X directional driving shaft 4, an Y directional guide shaft 5, a control unit 6, a mounting support 7, a cleaning mechanism 8, a base 9, and a heater 15.

The inkjet head group comprises heads as inkjet applying means for ejecting a liquid containing predetermined conductive fine particles from the nozzles (ejecting side) and for applying it to a substrate at a predetermined interval. The head group is formed by arranging a plurality of heads having a plurality of nozzles. This head group in which the plurality of heads are arranged is constructed in the same layout as shown in FIG. 14. That is, the respective heads are arranged to be inclined with respect to the scanning direction of heads.

The mounting support 7 is for mounting a substrate 101 to which the liquid droplets (liquid) is applied by an applicator, and comprises a mechanism for fixing the substrate 101 to a reference position.

An X directional driving motor 2 is connected to the X directional driving shaft 4. The X directional driving motor 2 is a stepping motor, etc., and if an X directional driving signals are supplied from the control unit 6, the X directional driving motor 2 rotates the X directional driving shaft 4. When the X directional driving shaft 4 is rotated, the inkjet head group 1 moves in the X direction.

The Y directional guide shaft 5 is fixed not to move with respect to the base 9. The mounting support 7 comprises a Y directional driving motor 3. The Y directional driving motor 3 includes a stepping motor, etc., and if the Y directional driving signals are supplied from the control unit 6, the Y directional driving motor 3 causes the mounting support 7 to move in the Y direction.

The control circuit 6 supplies voltage for controlling the ejection of liquid droplets, to the respective heads of the inkjet head group 1. Further, the control unit 6 supplies driving pulse signals for controlling the X directional movement of the inkjet head group 1, to the X directional driving motor 2, and supplies driving pulse signals for controlling the Y directional movement of the mounting support 7, to the Y directional driving motor 3.

The cleaning mechanism 8 comprises a mechanism for cleaning the inkjet head group 1. In the cleaning mechanism 8, a Y directional driving motor (not shown) is provided. By driving this Y directional driving motor, the cleaning mechanism 8 moves along the Y directional guide shaft 5. The control unit 6 also controls the movement of the cleaning mechanism 8.

The heater 15 is means for heating the substrate 101, herein, by lamp annealing, and carries out vaporization and drying of liquid applied to the substrate, and also to convert it into a conductive film. The control circuit 6 also controls the power input/interruption of the heater. Furthermore, the heat treatment may be carried out by using a hot plate or by using a dry furnace, instead of the heater.

Now, the structure as illustrated in FIG. 14 will be described.

As shown in the drawing, a plurality of inkjet heads is provided in the inkjet apparatus. The plurality of inkjet is arranged to be inclined in a direction intersecting the scanning direction, and then the drawing using the inkjet can be executed. For example, by inclining the inkjet heads at 30° with respect to the scanning direction, the drawing by the inkjet method is possible. By inclining the inkjet heads in a direction intersecting the scanning direction, the following advantages are obtained. That is, when a pattern gap is narrow, the nozzle gap is made visually narrow by inclining the heads. In this regard, it is possible to execute the drawing of narrow pitch pattern, and any pattern can be formed by varying the inclining angle. Further, in this case, the inkjet apparatus has a function in which the inkjet heads can be varied and adjusted at desired angles.

[Constitution of Head Unit]

Next, the constitution of the head unit 420 will be explained. FIG. 25 is a plan view illustrating a head unit provided in the liquid droplet ejection processing apparatus. FIG. 26 is a side view illustrating the head unit. FIG. 27 is a front view illustrating the head unit. FIG. 28 is a cross-sectional view illustrating the head unit.

The head unit 420 has, as shown in FIG. 25 and FIGS. 26 to 29, a head main body 430 and an ink supply unit 431. Further, the head main body 430 has a flat plate shaped carriage 426 and a plurality of headers 433 having substantially the same shapes and provided in the carriage 426.

(Constitution of Header)

FIG. 28 is an exploded perspective view illustrating the header 433 disposed in the head unit 420.

The header 433 has a printed board 435 of a strip shape, as shown in FIG. 28. In this printed board 435, various electrical parts 436 are mounted and electrical wiring lines (not shown) are provided. Further, a window portion 437 is formed to penetrate the printed board 435, at an longitudinal end side thereof. Furthermore, in the printed board 435, flow passages 438 through which a filter element material 13 as ink can flow are provided at both sides of the window portion 437.

Further, an inkjet head 421 is integrally attached to one surface side (lower surface side in FIG. 28) of the printed board 435 by an attaching member 440, substantially at its longitudinal one end side (right side in FIG. 28). This inkjet head 421 is formed in a longitudinally rectangular shape and bonded in a state in which the longitudinal direction thereof is arranged along the longitudinal direction of the printed board 435.

Further, it is preferable that the respective inkjet heads 421 in the respective headers 433 have substantially the same form, that is, for example, the respective inkjet heads 421 are a predetermined standard products and have a predetermined quality. Specifically, it is preferable that these inkjet heads 421 have the same number of nozzles which will be described later and the nozzle formation positions be equal each other, because it is efficient when assembling the inkjet head 421 in the carriage 426, and it enhances the assembling accuracy. Further, when using products made through the same manufacturing/assembling processes, it is not necessary to make specific products, so that it is possible to reduce cost.

Furthermore, connectors 441 electrically connected to the inkjet head 421 through electrical wiring lines 442 are integrally attached to the other surface side (upper surface side in FIG. 28) of the printed board 435, substantially at the other longitudinal end side (left side in FIG. 28). The electrical wiring lines 442 (including power source wiring lines and signal wiring lines) wired to a vice scanning driver 427 are connected to the connectors 441 so as not to influence movement of the head unit 420. The electrical wiring lines 442 connect a control device (not shown) to the head unit 420. That is, the electrical wiring lines 442, as schematically shown by an arrow of two dot chain in FIGS. 25 and 28, are wired from the vice scanning driver 427 toward the peripheral edge of the head unit 420, which is at both sides of the arrangement direction of two rows of the headers 433 in the head unit 420. The electrical wire lines 442 are then connected to the connector 441, and thus do not cause the electrical noises.

Furthermore, an ink introduction unit 443 is attached to the other surface side (upper surface side in FIG. 28) of the printed board 435, in such a manner to correspond to the inkjet head 421 substantially at one longitudinal end side (right side in FIG. 29). This ink introduction unit 443 has a positioning tube portion 445 of an substantially cylindrical shape which is provided in the attaching member 440 and into which a positioning pin 444 penetrating the printed board 435 is inserted, and a fixing claw portion 446 for fixing the ink introduction unit 443 to the printed board 435.

Furthermore, a pair of connecting portions 448 having approximately a cylindrical shape tapered toward its tip is projected from the ink introduction unit 443. These connecting portions 448 have openings (not shown) at a base end portions which would be directed toward the printed board 435, the openings communicating in a substantially liquid-tight manner with the flow passages 438 of the printed board 435, and openings (not shown) at the front end portion in which the filter element material 13 is capable of flowing the openings.

Furthermore, as shown in FIGS. 25 to 28, seal connecting portions 450 are respectively attached to these connection portions 448, at the pointed end side thereof. The cylindrical inner sides of these seal connecting portions 450 are formed in a cylindrical shape such that the connecting portions 448 are fitted thereinto in a liquid-tight manner, and seal members 449 are formed at the front ends thereof.

Further, pre-ejection and flushing are required for the drawing by the inkjet apparatus.

When forming cathode wire lines for connecting light-emitting power source lines to cathodes, the pre-ejection is previously carried out to the outside of the substrate. This is for preventing blocking of nozzles and ejecting a predetermined quantity of liquid droplets. The quantity of liquid droplets pre-ejected is about 200 to 5000 drops and is ejected from the whole nozzles formed in the inkjet head. Furthermore, the flushing is for ejecting the liquid droplets from the whole nozzles to ensure the stability of ejection. The quantity of ejection can be set properly, but it is preferable that the same quantity as that in the pre-ejection be ejected.

The liquid droplets ejected by the inkjet head are ejected in the order, for example, as shown in FIGS. 15 to 22. Now, the method of forming cathode wiring lines for connecting power source wiring lines for light emission to cathodes according to the present invention will be described below with reference to the drawings. Further, FIGS. 15 to 22 illustrates only pattern forming diagram and actually illustrates cathode wiring lines for connecting power source wiring lines for light emission to cathodes illustrated FIGS. 1 to 9.

FIG. 15 is a flowchart illustrating an embodiment of the pattern (i.e. cathode wiring lines for connecting power source wiring lines for light emission to cathodes) formation method according to the present invention.

In FIG. 15, a pattern formation method according to the present embodiment comprises a step (step S1) of cleaning a substrate on which the droplets of liquid material are applied by using a predetermined solvent and the like, a lyophobic processing step (step S2) of constituting a part of surface treatment step of the substrate, a lyophobic-property decreasing step (step S3) of constituting a part of the surface treatment step for adjusting the lyophobic property of the substrate surface on which the lyophobic processing step is carried out, a material arrangement step (step S4) of arranging on the surface-treated substrate the droplets of the liquid material containing a material for forming conductive film wire lines based on the liquid droplet ejection method to form (draw) a film pattern, an intermediate drying step (step S5) including heat/light treatment for removing at least a part of the solvent components of the liquid material arranged on the substrate including heat/light treatment, and a baking process (step S7) of baking the substrate on which a predetermined film pattern is formed. Further, after the intermediate drying step, it is determined whether a predetermined pattern drawing has been completed or not (step S6). If the pattern formation has been completed, the baking process is carried out. On the other hand, if the pattern drawing has not been completed, the material arrangement step is carried out.

Next, the material arrangement step (step S4) based on the liquid droplet ejection method which is characteristic of the present invention will be described with reference to FIGS. 16 to 22.

The material arrangement step of the present embodiment is a process for forming on the substrate the external connection terminals which are the film patterns (the wiring patterns) W in a the line shape, by ejecting the droplets of the liquid material containing the material for forming the conductive wires from the liquid droplet ejecting head onto the substrate. The liquid material is a liquid state substance obtained by dispersing in a dispersion medium conductive fine particles such as metal which is the material for forming the conductive film wire lines.

In FIG. 16, by ejecting the droplets of the liquid material from the ejecting nozzles 10A of the liquid droplet ejection heads 10 (the aforementioned head group) in the liquid droplet ejection apparatus to arrange the droplets on the substrate 11, the material arrangement step (step S4) comprises a first process (see FIG. 16(a)) of forming widthwise central portion (central pattern) W1 of the film pattern W on the substrate 11, a second process (see FIG. 16(b)) of forming one side portion (first side pattern) W2 on one side about the central pattern W1 formed on the substrate 11, and a third process (see FIG. 16(c)) of forming the other side portion (second side pattern) W3 on the other side about the central pattern W1 formed on the substrate 11. By means of the first, second and third processes, the film pattern W in a line shape are formed as shown in FIG. 16(c).

In the first process, as shown in FIG. 16(a), the liquid droplets of the liquid material are ejected from the liquid droplet ejection head 10 and arranged at a constant separation distance (pitch) on the substrate 11. Further, by repeating the liquid droplet arrangement step, the central pattern W1 in a line shape constituting a part of the film pattern W is formed at the central portion of a formation region W4 of the film pattern W on the substrate 11. Furthermore, since the surface of the substrate 11 is previously processed to have a desired lyophobic property in step S2 and step S3, diffusion of the liquid droplets arranged on the substrate 11 is suppressed. For this reason, it is possible to surely control the pattern shape in a good state and it is easy to obtain a thick film.

Here, after arranging the liquid droplets for forming the central pattern W1 on the substrate 11, the intermediate drying step (step S5) is carried out as needed in order to carry out the removal of the dispersion medium. The intermediate drying step may be a light treatment using lamp annealing, in addition to a general heat treatment using a heating apparatus such as a hot plate, an electric furnace and a hot air generator.

Next, in the second process, as shown in FIG. 16(b), the liquid droplets of the liquid material are ejected from the liquid droplet ejection head 10, and as a result, the first side pattern W2 in a line shape adjacent to one side of the central pattern W1 is formed. Here, the liquid droplet ejection head 10 ejects the liquid droplets to superpose the ejected liquid droplets with at least a part of the central pattern W1 formed on the substrate 11 when the first side pattern W2 is formed. In this regard, the liquid droplets constituting the central pattern W1 and the first side pattern W2 are surely connected to each other and discontinuous portions of the material for forming the conductive film wire are not generated in the formed film pattern W.

Further, in the second process, the liquid droplets are arranged at a constant pitch on the substrate 11, and by repeating this arrangement step, the first side pattern W2 constituting a part of the film pattern W is formed at one side of the formation region W4 of the film pattern W. Accordingly, the central pattern W1 and the first side pattern W 12 are integrated.

Here, after arranging liquid droplets for forming the first side pattern W2 on the substrate 11, the intermediate drying step (step S5) is carried out as needed in order to carry out the removal of the dispersion medium.

Next, in the third process, as shown in FIG. 16(c), the liquid droplets of the liquid material are ejected from the liquid droplet ejection head 10, and as a result, the second side pattern W3 in a line shape adjacent to the other side of the central pattern W1 is formed. Here, the liquid droplet ejection head 10 ejects liquid droplets to superpose the ejected liquid droplets with at least a part of the central pattern W1 formed on the substrate 11 when the second side pattern W3 is formed. In this regard, the liquid droplets constituting the central pattern W1 and the second side pattern W3 are surely connected to each other, and discontinuous portions of the material for forming the conductive film wire lines are not generated in the formed film pattern W. As a result, the central pattern W1 and the second side pattern W3 are integrated, and thus three patterns W1, W2, W3 in a line shape are integrated, thereby to form the film pattern W which are wide. Further, in the third process, the liquid droplets are arranged at a constant pitch, and by repeating this arrangement step, the second side pattern W3 constituting a part of the film pattern W is formed at the other side of the formation region W4 of the film pattern W.

At that time, by adjusting the position (the distance from the central pattern W1) where the liquid droplets are ejected in the second and third processes, it is possible to control the final line width of the film pattern W in the line shape. Further, by varying the height (the thickness) of the plurality of patterns W1, W2, and W3 formed in each of the first, second and third processes from the surface of the substrate 11, it is possible to control the film thickness of the film pattern W after integrating them.

Furthermore, when unevenness is formed in a profile of pattern, it is preferable that fine liquid droplets be applied as needed to fill the unevenness. These fine liquid droplets are the liquid droplets smaller than the liquid droplets normally applied (indicating the liquid droplets applied into W1, W2, W3), and its quantity of ejection is set to be smaller than that of the normal liquid droplets. As such, by applying fine liquid droplets, it is possible to form a straight line shaped pattern without unevenness in the profile thereof.

Next, with reference to FIGS. 17(a) to 17(c), the procedure in which the central pattern W1 in a line shape and the side patterns W2, W3 are formed will be described.

First, as shown in FIG. 17(a), the liquid droplets L1 ejected from the liquid droplet ejection head 10 are arranged sequentially with a predetermined pitch on the substrate 11. That is, the liquid droplet ejection head 10 arranges the liquid droplets L1 not to overlap each other on the substrate 11 (first arrangement step). In this example, the arrangement pitch P1 of the liquid droplets L1 is set larger than the diameter of the liquid droplets L1 right after arrangement on the substrate 11. This allows the liquid droplets L1 right after arrangement on the substrate 11 not to overlap each other (not to contact each other), and thus integration of the liquid droplets L1 and diffusion of the liquid droplets L1 on the substrate 11 is prevented. Further, the arrangement pitch P1 of the liquid droplets L1 is set smaller by two times or less than the diameter of the liquid droplets L1 right after arrangement on the substrate 11.

Here, after arranging the liquid droplets L1 on the substrate 11, the intermediate drying step (step S5) can be carried out as needed in order to carry out the removal of the dispersion medium. The intermediate drying step may be a light treatment using lamp annealing, in addition to a general heat treatment using a heating apparatus such as a hot plate, an electric furnace or a hot air generator as described above. In this case, the degree of the heating or the light irradiation may be increased until the conversion of the dispersion solution into a conductive film as well as the removal of the dispersion medium have done, but it is sufficient if the dispersion medium is removed to some extent.

Next, as shown in FIG. 17(b), the aforementioned arrangement steps of the liquid droplets are repeated. That is, similar to the last turn shown in FIG. 17(a), the liquid material is ejected as liquid droplets L2 from the liquid droplet ejection head 10 and the liquid droplets L2 are arranged at a constant pitch on the substrate 11.

At that time, the volume (the quantity of liquid material per one liquid droplet) of the liquid droplet L2 and the arrangement pitch P2 are the same as those of the liquid droplets L1 in the last turn. Further, the arranged positions of the liquid droplets L2 are shifted by ½ pitch from those of the liquid droplets L1 in the last turn, and the liquid droplets L2 in this turn are arranged at the intermediate positions between the liquid droplets L1 in the last turn arranged on the substrate 11 (second arrangement step). As shown in the drawing, by applying the second liquid droplets L2 to complement the spaces between the first liquid droplets L1 which were applied first, it is possible to form the wiring patterns (here, the external connection wires) excellent in planarity.

As described above, the arrangement pitch P1 of the liquid droplets L1 on the substrate 11 is larger than the diameter of the liquid droplets L1 right after the arrangement on the substrate 11 and smaller by two times or less than the diameter. For this reason, since the liquid droplets L2 are arranged at the intermediate positions between the liquid droplets L1, a part of the liquid droplets L2 overlaps the liquid droplets L1 and the spaces between the liquid droplets L1 are filled. At that time, the liquid droplets L2 in this turn contact the liquid droplets L1 in the last turn, but since the dispersion medium of the liquid droplets L1 in the last turn is previously removed completely or to some extent, the integration thereof to diffuse on the substrate 11 hardly occurs.

Furthermore, in FIG. 17(b), although the positions from which the arrangement of the liquid droplets L2 is started are on the same side (the left side in FIG. 17(a)) as in the last turn, it may be started from the opposite side (the right side). By carrying out the ejection of liquid droplets when moving them in each direction during reciprocation, it is possible to reduce the relative distance between the liquid droplet ejection head 10 the substrate 11.

After arranging the liquid droplets L2 on the substrate 11, the intermediate drying step can be carried out as needed in order to carry out the removal of the dispersion medium, similar to the last turn.

By repeating a series of arrangement steps of the liquid droplets a plurality of times, the spaces between the liquid droplets arranged on the substrate 11 are filled, and as shown in FIG. 17(c), the central pattern W1 and the side patterns W2, W3 constituting a continuous pattern in a line shape are formed on the substrate 11. In this case, by increasing the repeating times of the liquid droplet arrangement step, the liquid droplets sequentially overlap on the substrate 11. The film thickness of the patterns W1, W2, W3, that is, the height (thickness) from the surface of the substrate 11 increases. The height (thickness) of the line shaped patterns W1, W2, W3 is set in accordance with the desired film thickness required for the final film pattern, and repeating times of the liquid droplet arrangement step are set in accordance with the set film thickness.

Furthermore, the line shaped pattern formation method is not limited to the method shown in FIGS. 17(a) to 17(c). For example, the arrangement pitch of the liquid droplets or the quantity of shift in repeating may be set arbitrarily, and the arrangement pitch of the liquid droplets on the substrate P when the patterns W1, W2, W3 are formed may be set to values different from each other. For example, when the pitch of the liquid droplets in forming the central pattern W1 is P1, the pitch of the liquid droplets in forming the side patterns W2, W3 may be set wider (for example, P1×2) than P1. Of course, the pitch may be narrower (for example, P1×0.5) than P1. Further, the volume of the liquid droplet in forming the patterns W1, W2, W3 may be set to have values different from each other. Otherwise, the arrangement atmosphere (temperature, humidity, etc.) of liquid droplets which is an atmosphere where the substrate 11 or the liquid droplet ejection head 10 is disposed in each of the first, second and third processes, that is, the environmental conditions for arranging material, may be set to have conditions different from each other.

Furthermore, in the present embodiment, although the plurality of side patterns W2, W3 are formed one by one, two may be formed at the same time. Here, in a case that the plurality patterns W2, W3 are formed one by one and in a case that two are formed at the same time, since sum of the number of the drying steps may be different, it is preferable that the drying conditions be set not to damage the lyophobic property of the substrate 11.

Furthermore, in the present embodiment, although one central pattern W1 is formed in the first process, two or more central patterns W1 may be formed. Further, by ejecting the liquid droplets to both sides of the plural central patterns W1 to make them continuous, it is possible to easily form the film pattern having wider line width.

Furthermore, although the liquid droplets can be applied using any one of nozzles, the liquid droplets may be applied using other nozzles in order to suppress the deviation in the quantity of ejection of the liquid droplets between nozzles. For example, it is preferable that a first nozzle be used for the application of the liquid droplets L1 and a second nozzle different from the first nozzle be used for the application of the liquid droplets L2 complementing the spaces between the liquid droplets L1. Furthermore, although the first nozzle and the second nozzle may be provided in the same head, since a plurality of heads are formed as described above, the nozzles may be formed in different heads, respectively. That is, the first nozzle may be formed in a first head, the second nozzle may be formed in a second head. Accordingly, when forming a desired pattern, the application may be carried out using the first nozzle and the second nozzle.

Next, with reference to FIGS. 18 to 22, an example of the procedure in which liquid droplets are ejected on the substrate will be described. As shown in these drawings, a lattice-shaped bit map having pixels of plural unit regions from which the liquid droplets of liquid material is set on the substrate 11. The liquid droplet ejection head 10 ejects liquid droplets toward pixel positions set in the bit map. Herein, one pixel is set to a square shape. Further, the liquid droplet ejection head 10 ejects the liquid droplets from the ejection nozzle 10A while scanning in the Y axial direction with respect to the substrate 11. In the description with reference to FIGS. 18 to 22, "1" is given to the liquid droplets ejected from a first scanning, and "2", "3", . . . and "n" are given to the liquid droplets ejected from a second scanning, a third scanning, . . . and, an n-th scanning, respectively. Furthermore, in the following description, the liquid droplets are ejected to each of the regions (pattern formation region) indicated by a gray color in FIG. 18 to form the film pattern W.

As shown in FIG. 18(a), in the first scanning, the liquid droplets are ejected with one pixel in the central pattern formation region apart in order to form the central pattern W1. Herein, the liquid droplets ejected to the substrate 11 are landed in the substrate 11 and then are integrated and diffused on the substrate. That is, as indicated by circles in FIG. 18(a), the liquid droplet landed on the substrate 11 are integrated and diffused to have a diameter larger than the size of one pixel. Herein, since liquid droplets are ejected with a predetermined interval (one pixel) in the Y axial direction, the liquid droplets arranged on the substrate 11 are set not to overlap each other. In this regard, it is possible to prevent the liquid material from being excessively provided on the substrate 11 in the Y axial direction and it is also possible to prevent generation of bulge.

Furthermore, in FIG. 18(a), although the liquid droplets when ejected to the substrate 11 are arranged not to overlap each other, the liquid droplets may be arranged to overlap each other a little. Further, although the droplets are ejected with one pixel spaced, the liquid droplets may be ejected with any number, i.e. two or more, of pixel interval. In this case, it is preferable that the number of scanning operation and ejecting operation of the liquid droplet ejection head 10 on the substrate 11 is increased to complement the spaces between the liquid droplets on the substrate.

FIG. 18(b) is a schematic view when the liquid droplets are ejected to the substrate 11 from the ejection nozzle 10A of the liquid droplet ejection head 10 through the second scanning. Further, in FIG. 18(b), "2" is given to the liquid droplets ejected during the second scanning. In the second scanning, the liquid droplets are ejected to complement the spaces between the liquid droplets "1" ejected from the first scanning. Further, the central pattern W1 is formed to be continuous between the liquid droplets, by the first and second scanning and ejecting operation.

Next, the liquid droplet ejection head 10 and the substrate 11 are relatively shifted in the X axial direction by a size of one pixel interval. Here, the liquid droplet ejection head 10 is step-shifted in the −X direction with respect to the substrate 11 by the size of one pixel. Then, the liquid droplet ejection head 10 carries out the third scanning. In this regard, as shown in FIG. 19(a), the liquid droplets "3" for forming the first side pattern W2 are arranged on the substrate 11 so as to be adjacent to the −X side of the central pattern W1. Here, the liquid droplets "3" are arranged with a size of one pixel interval in the Y axial direction. Here, the liquid droplets "3" in the first scanning (that is, the third scanning in total) after the step-shift of the liquid droplet ejection head 10 in the X axial direction are arranged at positions adjacent to the liquid droplets "1" in the first scanning before the step-shift to the X axis.

FIG. 19(b) is a schematic view when liquid droplets are ejected to the substrate 11 from the liquid droplet ejection head 10 through the fourth scanning. In FIG. 19(b), "4" is given to the liquid droplets ejected from the fourth scanning. In the fourth scanning, the liquid droplets are ejected to complement the spaces between the liquid droplets "3" ejected from the third scanning. Then, the first side pattern W2 is formed to be continuous between the liquid droplets by the third and fourth scanning and ejecting operation. Here, the liquid droplets "4" in the second scanning (that is, the fourth scanning in total) after the step-shift are arranged at positions adjacent to the liquid droplets "2" in the second scanning before the step-shift to the X axis.

Next, the liquid droplet ejection head 10 and the substrate 11 are relatively shifted in the X axial direction by the size of two pixels. Here, the liquid droplet ejection head 10 is step-shifted in the +X direction with respect to the substrate. Then, the liquid droplet ejection head 10 carries out the fifth scanning. In this regard, as shown in FIG. 20(a), the liquid droplets "5" for forming the second side pattern W3 are arranged on the substrate so as to be adjacent to the +X side of the central pattern W1. Here, the liquid droplets "5" are arranged with a size of one pixel interval in the Y axial direction. Here, the liquid droplets "5" in the fifth scanning after the step-shift of the liquid droplet ejection head 10 in the X axial direction are arranged at positions adjacent to the liquid droplets "1" to the X axis.

FIG. 20(b) is a schematic view when the liquid droplets are ejected to the substrate 11 from the liquid droplet ejection head 10 through the sixth scanning. In FIG. 20(b), "6" is given to the liquid droplets ejected from the sixth scanning. In the sixth scanning, the liquid droplets are ejected to complement the spaces between the liquid droplets "5" ejected from the fifth scanning. Then, the second side pattern W3 is formed to be continuous between the liquid droplets by the fifth and sixth scanning and ejecting operation. Here, the liquid droplets "6" in the sixth scanning are arranged at positions adjacent to the liquid droplets "2" to the X axis.

As such, for one pattern, although the same nozzle can eject the liquid droplets, the liquid droplets may be ejected from different nozzles as described above. The ejection method when the different nozzle ejects the liquid droplets is the same as described above. Further, such utilization of nozzle can similarly apply to examples to be described below.

FIG. 21 is a view illustrating an example in which the arrangement procedure of ejected positions of the liquid droplets is changed. In FIG. 21, at positions adjacent to the X axis of the liquid droplets "1" for forming the central pattern W1, on the −X side, the liquid droplets "4" ejected from the second scanning (the fourth scanning in total) after the step shift in the X axial direction of the liquid droplet ejection head 10 are arranged, while at positions adjacent to the X axis of the liquid droplets "2" for forming the central pattern W1, on the −X side, the liquid droplets "3" ejected from the first scanning (the third scanning in total) after the step shift in the X axial direction of the liquid droplet ejection head 10 are arranged. Similarly, at positions adjacent to the X axis of the liquid droplets "1", on the +X side, the liquid droplets "6" ejected from the sixth scanning in total are arranged, while at positions adjacent to the X axis of the liquid droplets "2" for forming the central pattern W1, on the +X side, the liquid droplets "5" ejected from the fifth scanning in total are arranged. As such, when forming the respective lines W1, W2, W3, the order of ejected positions of the liquid droplets may be set to be different for every line.

Furthermore, as in the example shown in FIG. 22, the procedure may be set such that the liquid droplets "1" for forming the central pattern W1 are arranged, the liquid droplet ejection head 10 is then step-shifted, the liquid droplets "2" for forming the first side pattern W2 are then arranged, the liquid droplet ejection head 10 is then step-shifted, and then the liquid droplets "3" for forming the second side pattern W2 are arranged. Further, the liquid droplets "4", "5", "6" are sequentially ejected to complement them. As such, when forming the side patterns W2, W3 after forming the central pattern W1, the formation of the side patterns W2, W3 may start from a state when the formation of the central pattern W1 is not completed, instead of forming the side patterns W2, W3 after the formation of the central pattern W1 is completed.

FIGS. 23(a) and 23(b) are views illustrating an example of the arrangement of the liquid droplets for formation of the first and second side patterns W2, W3 on both sides of the central pattern W1 in the second and third processes. In the example of FIG. 23(a), the central pattern W1 is formed under the same conditions as the ejecting conditions (the arranging conditions) described referring to FIG. 17. On the other hand, the ejecting conditions (the arranging conditions) in the second and third processes are different from the ejecting conditions for forming the central pattern W1. Specifically, the volume of liquid droplets Ln is set greater than that in the first process. That is, the quantity of liquid material ejected at one time is increased. Further, in this example, the arrangement pitch of the liquid droplets Ln is the same as the first process. By increasing the volume of the liquid droplets Ln, it is possible to reduce the total time for forming the film pattern W and thus to accomplish improvement in throughput. Furthermore, since the increased volume of liquid droplets is apt to cause the bulge, the volume condition of the liquid droplets in which the bulge is not rendered in accordance with the material characteristics of the liquid material is previously obtained, and then the maximum possible volume of the liquid droplets to be ejected may be set based on the obtained condition.

In the example of FIG. 23(b), in the ejecting conditions of the second and third processes, the arrangement pitch of the liquid droplets Ln is narrower than that of the first process. Further, the volume of the liquid droplets Ln may be the same as the first process or larger than the first process, as shown in FIG. 23(a). By narrowing the arrangement pitch of the liquid droplets, the quantity of arrangement of liquid droplets per unit area increases, so that the pattern can be formed in a short time.

Various ejection methods are described above, but a method of ejecting liquid droplets with different nozzles will be complemented below.

When forming one pattern (here, one line), it can be formed by a plurality of nozzles. For example, a first nozzle applies the liquid droplets in the first turn and a second nozzle different from the first nozzle can apply the liquid droplets in the second turn. Further, a third nozzle applies the liquid droplets in the third turn and a fourth nozzle can apply the liquid droplets in the fourth turn. By using this applying method, when there is nonuniformity in quantity of ejection due to the nozzles, the nonuniformity thereof can be suppressed to the minimum. That is, when the same nozzle executes the application, the total quantity of ejection of liquid droplets varies. As a result, the difference in film thickness and the difference in resistance value in the electrodes are influenced. Therefore, in order to solve such problems, by applying liquid droplets by different nozzles for one electrode (or one pattern), it is possible to suppress the difference in film thickness to the minimum, and it is also possible to make the resistance of electrode substantially uniform.

<Surface Treatment Step>

Next, the surface treatment steps S2, S3 shown in FIG. 15 will be described. In the surface treatment step, the surface of a substrate on which a conductive wiring film (external connection terminals) is formed is processed to be lyophobic to the liquid material (step S2).

Specifically, the surface treatment is carried out on the substrate such that a predetermined contact angle with respect to the liquid material containing conductive fine particles is 60° or more, and preferably 90° or more and 110° or less. The method of controlling lyophobic property (wettability) can include, for example, a method of forming self-organization film on the substrate, a plasma treatment method, a UV irradiation method, etc.

In the self-organization-film formation method, the self-organization film made of organic molecular film, etc. is formed on the surface of the substrate to be formed with a conductive wiring film. The organic molecular film for treating the substrate surface comprises a functional group capable of being coupled to the substrate, a functional group of reforming the surface property (controlling the surface energy) of the substrate such as the lyophilic radical or the lyophobic radical on the opposite side thereof, and straight chain of carbons or chain of carbons partially branched for connecting the functional groups to each other. Therefore, the organic molecular film is coupled to the substrate and self-organized to form a molecular film, for example, a monomolecular film.

Here, the self-organization film comprises a coupling functional group capable of reacting with the constituent atoms of the underlying layer, etc. of the substrate and other straight chain molecules. The self-organization film is a film formed by aligning compounds having very high orientation property due to the interaction between the straight molecules. Since the self-organization film is formed by orienting mono-molecules, the film thickness can be very thin and a uniform film at a molecule level is obtained. That is, since the same molecules are positioned on the surface of film, it is possible to give a uniform and excellent lyophobic property or lyophilic property to the surface of film.

By using, for example, fluoroalkylsilane as a compound having the high orientation property, the respective compounds are oriented such that the fluoroalkyl radical is positioned on the film surface to form a self-organization film and a uniform lyophobic property is given to the film surface.

The compound of forming a self-organization film can include fluoroalkylsilane (hereinafter, referred to as "FAS") such as heptadecafluoro-1,1,2, 2tetrahydrodesiltriethoxysilane, heptadecafluoro-1,1,2, 2tetrahydrodesiltrimethoxysilane, heptadecafluoro-1,1,2, 2tetrahydrodesiltrichlorosilane, tridecafluoro-1,1,2, 2tetrahydrooctyltriethoxysilane, tridecafluoro-1,1,2, 2tetrahydrooctyltrimethoxysilane, tridecafluoro-1,1,2, 2tetrahydrooctyltrichlorosilane, trifluoropropyltrimethoxysilane, etc. These compounds may be used separately or in combination of two or more thereof. Furthermore, by using FAS, the close adherence to the substrate and the excellent lyophobic property can be obtained.

FAS is generally expressed in a structural formula RnSiX (4−n). Here, n, indicates an integer of 1 or more and 3 or less, and X indicates a hydrolytic radical such as a methoxy radical, ethoxy radical, halogen atom, etc. Further, R is a fluoroalkyl radical and has a structure (CF3)(CF2)x(CH2)y (here, x is an integer of 0 or more and 10 or less, and y is an integer of 0 or more and 4 or less), and when a plurality of R or X is coupled to Si, R or X may be the same or different from each other, respectively. The hydrolytic radical indicated by X forms silanol through the hydrolysis and reacts with hydroxyl radical of a base of the substrate (glass, silicon) to be coupled to the substrate with a siloxane bond. On the other hand, since R has fluoro radical such as (CF3) at the surface thereof, it reforms the base surface of the substrate into a non-wettable) surface (having a low surface energy).

The self-organization film comprising the organic molecular film, etc. is formed on the substrate by putting the aforementioned raw material compounds and the substrate in the same sealed vessel and leaving them alone at a room temperature for two or three days. Further, by maintaining the sealed vessel at 100° C., the self-organization film is formed on the surface within about three hours. Although the self-organization film is formed in a vapor phase, the self-organization film may be formed in a liquid phase. For example, by immersing the substrate in a solution containing raw material compounds, and then cleaning and drying the substrate, a self-organization film is formed on the substrate. Furthermore, before the formation of the self-organization film, by irradiating the surface of the substrate with UV light or by cleaning the substrate with a solvent, it is preferable that the pre-treatment be carried out on the substrate surface.

After carrying out the FAS treatment, the lyophobic-property decreasing step of treating the substrate so as to have a desired lyophobic property is carried out as needed (step S3). That is, when the FAS treatment is carried out as the lyophobic processing step, the film pattern W formed on the substrate may be easily peeled off from the substrate due to excessively intensive lyophobic property. Therefore, the step of decreasing (adjusting) the lyophobic property is carried out. The step of decreasing the lyophobic property can includes the UV irradiation treatment with a wavelength of about 170 to 400 nm. By irradiating the substrate with UV of a predetermined power for a predetermined time, the lyophobic property of the substrate on which the FAS treatment is carried out decreases, and as a result, the substrate has a desired lyophobic property. Otherwise, by exposing the substrate to the ozone atmosphere, the lyophobic property of the substrate can be controlled.

On the other hand, in the plasma treatment method, the plasma irradiation is carried out on the substrate at a normal pressure or under vacuum. The kind of gas to be used for the plasma treatment can be selected variously in consideration of the quality of the surface of a substrate to form a conductive wiring film. The process gas can include, for example, 4-fluoro methane, perfluorohexane, perfluorodecane, etc.

A treatment of processing the substrate surface so as to have a lyophobic property may be carried out by adhering a film having desired lyophobic property, for example, a polyimide film processed with tetrafluoroethylene, to the substrate surface. Further, the polyimide film having a high lyophobic property may be used as a substrate as it is.

By carrying out such surface treatment on the surface on which the external connection terminals are formed, when liquid droplets are ejected thereto, it is possible to form a wiring pattern having a good planarity and a small unevenness in a profile. Furthermore, when the electrodes 73, 74, 75 are formed, the aforementioned surface treatment is carried out on the second interlayer insulating layer 283. Furthermore, when electrodes are formed at positions corresponding to the transparent electrode 77 by the inkjet method, electrodes (external connection terminals) can be formed on the uppermost layer thereof by the inkjet method by carrying out the surface treatment on the electrodes 73, 74, 75 corresponding to the lower layer.

<Intermediate Drying Step>

Next, the intermediate drying step S5 shown in FIG. 15 will be described in detail. In the intermediate drying step (heat/light treatment step), a dispersion medium or a coating material contained in the liquid droplets on the substrate is removed. That is, in the liquid material for conductive film formation disposed on a substrate, it is necessary to remove the dispersion medium in order to facilitate electrical contact between particles. Further, when the coating material such as organic material and the like is applied on the surface of the conductive fine particles in order to enhance the dispersibility, it is also necessary to remove the coating material.

Although the heat/light treatment is typically carried out in the atmosphere, it may be carried out in an atmosphere of inert gas such as nitrogen, argon or helium, if necessary. The temperature of heat/light treatment is appropriately determined in consideration of the boiling point (vapor pressure) of the dispersion medium, the type or pressure of the atmosphere gas, the thermal behavior such as dispersibility or oxidative of particles, the presence or quantity of the coating material, the heat resistant temperature of the base material, and the like. For example, in order to remove the coating material made of organic material, it is necessary to carry out baking at about 300° C. Further, when a substrate made of plastic and the like is used, it is preferable that the sintering be carried out at the room temperature or more and 100° C. or less.

In the heat treatment, for example, a heating apparatus such as a hot plate or an electric furnace may be used. In the light treatment, lamp annealing may be used. In the light treatment, an infrared lamp, a xenon lamp, a YAG laser, an argon laser, a carbonic acid gas laser, or an excimer laser using XeF, XeCl, XeBr, XrF, KrCl, ArF, ArCl, etc. is used as a light source used for the annealing, though it is not specifically limited to them. These light sources having power output range between 10 W and 5000 W are generally used, but in the present embodiment, it is sufficient that these light sources have power output range between 100 W and 1000 W. When the electrical contact between fine particles is surely established by the aforementioned heat/light treatment, the dispersion solution is converted into a conductive film.

Furthermore, at that time, it is allowable to raise the degree of the heating or the light irradiation until the dispersion solution is converted into a conductive film as well as the removal of the dispersion medium. However, since the conversion of the conductive film may be allowed to be carried out in the heat treatment/light treatment step in a bundle after the completion of the arrangement of all of the liquid materials, here it is sufficient if some portion of the dispersion medium can be removed. For example, in the heat treatment, it is allowable to carry out the heating at typically about 100° C. for several minutes. Further, the drying treatment may proceed at the same time along with the ejection of the liquid droplet. For example, the substrate is previously heated, or a dispersion medium having low boiling point is used along with the cooling of the liquid droplet ejection head, so that the drying of liquid droplets can be proceeded just after the arrangement of liquid droplets on the substrate.

Thus manufactured electro-optical device is applicable to displays such as a liquid crystal display device, a plasma display device as shown in FIG. 24, an inorganic EL device, or electrophoretic device in addition to the aforementioned organic EL device. Further, the electro-optical device is applicable to monitors such as a portable apparatus, a mobile type electronic apparatus or a car navigator.

BRIEF DESCRIPTION OF THE DRAWINGS

[FIG. 1]

FIG. 1 schematically illustrates the wiring structure of a light-emitting device according to an embodiment of the present invention.

[FIG. 2]

FIG. 2 is a schematic plan view of the light-emitting device of the present embodiment.

[FIG. 3]

FIG. 3 is a cross-sectional view taken along the line A–A' in FIG. 2.

[FIG. 4]

FIG. 4 is a cross-sectional view taken along the line B–B' in FIG. 2.

[FIG. 5]

FIG. 5 is a cross-sectional view illustrating an essential part of a pixel electrode group region 11a.

[FIG. 6]

FIG. 6 is a process view for explaining a method of manufacturing a light-emitting device according to an embodiment of the present invention.

[FIG. 7]

FIG. 7 is a process view for explaining a method of manufacturing a light-emitting device according to an embodiment of the present invention.

[FIG. 8]

FIG. 8 is a process view for explaining a method of manufacturing a light-emitting device according to an embodiment of the present invention.

[FIG. 9]

FIG. 9 is a process view for explaining a method of manufacturing a light-emitting device according to an embodiment of the present invention.

[FIG. 10]

FIG. 10 is a view illustrating an example of an electronic apparatus comprising the light-emitting device according to an embodiment of the present invention.

[FIG. 11]

FIG. 11 is a perspective view illustrating a portable phone as another electronic apparatus.

[FIG. 12]

FIG. 12 is a view illustrating the wiring structure of a conventional light-emitting device.

[FIG. 13]

FIG. 13 is a view illustrating the structure of an applicator.

[FIG. 14]

FIG. 14 is a plan view illustrating a head unit.

[FIG. 15]

FIG. 15 is a flow chart illustrating an embodiment of a pattern formation method according to the present invention.

[FIG. 16]

FIG. 16 is a schematic view illustrating an embodiment of a pattern formation method according to the present invention.

[FIG. 17]

FIG. 17 is a schematic view illustrating an embodiment of a pattern formation method according to the present invention.

[FIG. 18]

FIG. 18 is a schematic view illustrating a state where liquid droplets are arranged based on a bit map data set up on a substrate.

[FIG. 19]

FIG. 19 is a schematic view illustrating a state where liquid droplets are arranged based on a bit map data set up on a substrate.

[FIG. 20]

FIG. 20 is a schematic view illustrating a state where liquid droplets are arranged based on a bit map data set up on a substrate.

[FIG. 21]

FIG. 21 is a schematic view illustrating another embodiment of a state where liquid droplets are arranged based on a bit map data set up on a substrate.

[FIG. 22]

FIG. 22 is a schematic view illustrating another embodiment of a state where liquid droplets are arranged based on a bit map data set up on a substrate.

[FIG. 23]

FIG. 23 is a schematic view illustrating another embodiment of a pattern formation method according to the present invention.

[FIG. 24]

FIG. 24 is an exploded perspective view illustrating an example where an electro-optical device according to an embodiment of the present invention is applied to a plasma type display device.

[FIG. 25]

FIG. 25 is a side view illustrating a head unit.

[FIG. 26]

FIG. 26 is a front view illustrating the head unit.

[FIG. 27]

FIG. 27 is a cross-sectional view illustrating the head unit.

[FIG. 28]

FIG. 28 is a perspective view illustrating the head unit.

[REFERENCE NUMERALS]

4: EFFECTIVE LIGHT-EMITTING REGION
5: DUMMY REGION
12: CATHODE (SECOND ELECTRODE)
101: SCANNING LINE
102: SIGNAL LINE
103: POWER SOURCE WIRING LINE FOR LIGHT EMISSION
110: LIGHT-EMITTING ELEMENT
110a: HOLE INJECTING/CARRYING LAYER
110b: LIGHT-EMITTING LAYER
111: PIXEL ELECTRODE (FIRST ELECTRODE)
112: SWITCHING THIN FILM TRANSISTOR (FIRST SWITCHING ELEMENT)
122: BANK PORTION (INSULATING PORTION)
123: CURRENT THIN FILM TRANSISTOR (SECOND SWITCHING ELEMENT)
212: DUMMY BANK PORTION (BANK)
283: SECOND INTERLAYER INSULATING LAYER
284: FIRST INTERLAYER INSULATING LAYER

What is claimed is:

1. A method of manufacturing an electro-optical device that includes light-emitting elements, each having a light-emitting layer formed between a first electrode and a second electrode, and a power source wiring line for light emission coupled to either the first electrode or the second electrode electrically, the method comprising:

forming the power source wiring line for light emission by applying liquid material including conductive material.

2. A method of manufacturing an electro-optical device that includes light-emitting elements, each having a light-emitting layer formed between a first electrode and a second electrode, and a power source wiring line for light emission, the power source wiring line for light emission being formed of a plurality of conductive layers and coupled to either the first electrode or the second electrode electrically, the method comprising:

forming at least one layer of the plurality of conductive layers by applying liquid material including conductive material.

3. The method of manufacturing an electro-optical device according to claim 2, further including forming the uppermost conductive layer among the plurality of conductive layers by applying liquid material including conductive material.

4. A method of manufacturing an electro-optical device that includes a plurality of light-emitting elements having a light-emitting layer between a cathode and an anode, a cathode wiring line connected to the cathode, the method comprising:

forming the cathode wiring line by applying liquid material including conductive material.

5. A method of manufacturing an electro-optical device formed with a plurality of light-emitting elements having a light-emitting layer between a cathode and an anode, a cathode wiring line connected to the cathode being formed of a plurality of conductive layers; the method comprising:

forming at least one layer of the cathode wiring line by applying liquid material including conductive material.

6. The method of manufacturing an electro-optical device according to claim 5, further including forming the uppermost layer among the plurality of conductive layers by applying liquid material including conductive material.

7. The method of manufacturing an electro-optical device according to claim 1, further including applying the liquid material by an inkjet method.

8. An electro-optical device formed by the method according to claim 1.

9. An electronic apparatus, comprising: the electro-optical device according to claim 8.

10. The method of manufacturing an electro-optical device according to claim 1, the power source wiring line being formed as a stacked wiring structure.

11. The method of manufacturing an electro-optical device according to claim 2, the power source wiring line being formed as a stacked wiring structure.

12. The method of manufacturing an electro-optical device according to claim 4, the power source wiring line being formed as a stacked wiring structure.

13. The method of manufacturing an electro-optical device according to claim 5, the power source wiring line being formed as a stacked wiring structure.

* * * * *